US009219061B2

United States Patent
Suzuki et al.

(10) Patent No.: US 9,219,061 B2
(45) Date of Patent: Dec. 22, 2015

(54) SEMICONDUCTOR DEVICE AND MANUFACTURING METHOD OF SEMICONDUCTOR DEVICE

(71) Applicant: Renesas Electronics Corporation, Kawasaki-shi, Kanagawa (JP)

(72) Inventors: Kazutaka Suzuki, Kanagawa (JP); Takahiro Korenari, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 14 days.

(21) Appl. No.: 13/899,063

(22) Filed: May 21, 2013

(65) Prior Publication Data

US 2013/0320454 A1     Dec. 5, 2013

(30) Foreign Application Priority Data

May 29, 2012  (JP) ................................. 2012-121503

(51) Int. Cl.
| | |
|---|---|
| *H01L 21/70* | (2006.01) |
| *H01L 27/088* | (2006.01) |
| *H01L 29/66* | (2006.01) |
| *H01L 23/31* | (2006.01) |
| *H01L 27/02* | (2006.01) |
| H01L 21/8234 | (2006.01) |

(52) U.S. Cl.
CPC ...... *H01L 27/088* (2013.01); *H01L 21/823487* (2013.01); *H01L 23/3114* (2013.01); *H01L 27/0207* (2013.01); *H01L 29/66477* (2013.01); H01L 21/823418 (2013.01); H01L 2924/0002 (2013.01)

(58) Field of Classification Search
CPC ..................... H01L 29/0692; H01L 29/66477; H01L 27/088; H01L 23/3114; H01L 2224/16; H01L 29/41741; H01L 29/4238; H01L 2924/13034; H01L 2924/13091
USPC ................. 257/328, 329, 334, 206, 401, 368; 438/197

See application file for complete search history.

(56) References Cited

U.S. PATENT DOCUMENTS

| | | | | |
|---|---|---|---|---|
| 8,536,643 | B2 * | 9/2013 | Shirai et al. ................... | 257/330 |
| 2001/0045635 | A1 * | 11/2001 | Kinzer et al. ................. | 257/685 |
| 2004/0129864 | A1 * | 7/2004 | Yamagishi ................ | 250/214 R |
| 2008/0099926 | A1 | 5/2008 | Yoshida | |
| 2010/0314693 | A1 * | 12/2010 | Su et al. ........................ | 257/401 |

FOREIGN PATENT DOCUMENTS

| | | |
|---|---|---|
| JP | 2004-502293 A | 1/2004 |
| JP | 2008-109008 A | 5/2008 |

* cited by examiner

*Primary Examiner* — Matthew Landau
*Assistant Examiner* — Eric Ashbahian
(74) *Attorney, Agent, or Firm* — Sughrue Mion, PLLC

(57) ABSTRACT

A semiconductor device capable of reducing an inter-source electrode resistance RSS(on) and reducing a chip size is provided. A semiconductor device according to the present invention includes a chip partitioned into three areas including a first area, a second area, and a third area, and a common drain electrode provided on a back surface of the chip, in which the second area is formed between the first and third areas, a first MOSFET is formed in the first area and the third area, and a second MOSFET is formed in the second area.

16 Claims, 22 Drawing Sheets

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from Japanese patent application No. 2012-121503, filed on May 29, 2012, the disclosure of which is incorporated herein in its entirety by reference.

BACKGROUND

The present invention relates to a semiconductor device and a manufacturing method of a semiconductor device. For example, the present invention relates to a semiconductor device including an insulated gate type field-effect transistor having a vertical transistor structure, and its manufacturing method.

The development of a CSP (Chip Size Package) type MOSFET (Metal-Oxide-Semiconductor Field-Effect Transistor) for lithium-ion (Li+) battery protection (EFLIP: Ecologically Flip chip MOSFET for Lithium-Ion battery Protection) has been underway from the past. As a MOSFET like this, a one-chip dual type MOSFET structure in which a drain electrode composed of a metal plate or a metal film is disposed on the back surface has been known (Japanese Unexamined Patent Application Publication No. 2008-109008 (Yoshida) and Published Japanese Translation of PCT International Publication for Patent Application, No. 2004-502293 (Kinzer et al.)).

In a semiconductor device disclosed in Yoshida, two MOSFETs are packed on one semiconductor substrate by using a common drain electrode (not shown) formed on the back surface. On the first source electrode, two first source bump electrodes connected to this first source electrode are disposed. On the second source electrode, two second source bump electrodes connected to this second source electrode are disposed.

The first source bump electrodes and the second source bump electrodes are arranged along a short side of the chip. A first gate bump electrode is disposed between the first source bump electrodes and a second gate bump electrode is disposed between the second source bump electrodes. In the MOSFET having the structure like this, a current path is formed in a direction along the short side of the chip and a current flows through the common drain electrode disposed on the back surface.

Further, in a semiconductor device disclosed in Kinzer et al., the chip is partitioned into four areas and FETs 1 and FETs 2 are alternately arranged. Each of the FET 1 and the FET 2 has a U-shape, and the FET 1 and the FET 2 are engaged with each other. The gate pads G1 and G2 of the FETs 1 and 2 are formed, within the areas of their respective FETs 1 and 2, at opposed corners of the chip.

SUMMARY

The present inventors have found the following problem. In the one-chip dual type MOSFET, a resistance RSS(on) between these source electrodes (hereinafter called "inter-source electrode resistance RSS(on)") is used as an indicator of its performance, and it has been desired to reduce this inter-source electrode resistance RSS(on). The inter-source electrode resistance RSS(on) includes a chip resistance R(chip), an Al spreading resistance R(Al), and a back-surface resistance R(back-metal) when the one-chip dual type MOSFET is in a conduction state.

In Yoshida, the back-surface resistance R(back-metal) is reduced by forming a horizontal-direction current path in the semiconductor substrate in a direction along a short side of the chip. However, in Yoshida, since the aspect ratio of the chip needs to be increased, the chip size becomes larger. Therefore, there is a possibility that problems occur in terms of the packaging easiness or the packaging reliability.

A first aspect is a semiconductor device obtained by: partitioning a chip into three areas including a first area, a second area, and a third area in such a manner that the second area is formed between the first and third areas, forming a first MOSFET in the first area and the third area, forming a second MOSFET in the second area, and forming a common drain electrode on a back surface of the chip.

According to the aspect, it is possible to provide a semiconductor device capable of reducing an inter-source electrode resistance RSS(on) without increasing the chip size.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments according to the aspect are explained hereinafter in detail with reference to the drawings. Note that the same symbols are assigned to components having the same functions throughout all the drawings for explaining embodiments, and repeated explanations are omitted. Further, the embodiments are not unrelated with each other, unless otherwise specified. That is, they are related in such a manner that one embodiment is a modified example, a detailed example, or a supplementary example of a part or the whole of another embodiment.

A semiconductor device according to an embodiment relates to a one-chip dual type MOSFET including a common drain electrode on the back surface. One of the MOSFETs is divided into two areas and the other MOSFET is disposed so as to be sandwiched between the two divided areas of the one MOSFET. As a result, the effective aspect ratio is improved without increasing the overall aspect ratio of the chip, and thus making it possible to reduce the inter-source electrode resistance RSS(on).

First Embodiment

Figure 1:
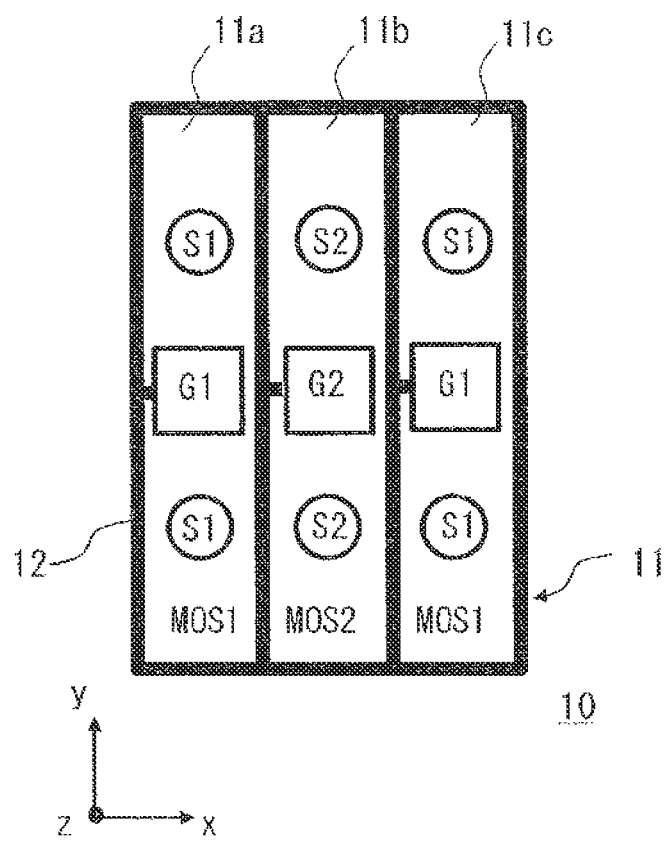
FIG. 1 shows a configuration of a semiconductor device according to a first embodiment.

A configuration of a semiconductor device according to a first embodiment is explained hereinafter with reference to FIG. 1. FIG. 1 shows a configuration of a semiconductor device 10 according to a first embodiment. As shown in FIG. 1, the semiconductor device 10 includes a chip 11, a gate line 12, gate pads G1 and G2, and source pads S1 and S2. In this embodiment, the chip 11 has a rectangular shape. Further, the short-side direction is defined as "x-direction"; the long-side direction is defined as "y-direction"; and the height direction is defined as "z-direction". Note that the directions are also defined in the same manner throughout the drawings.

The chip 11 is partitioned into three areas including a first area 11a, a second area 11b, and a third area 11c. The first area 11a, the second area 11b, and the third area 11c are disposed in this order along the x-direction. That is, the second area 11b is disposed between the first area 11a and the third area 11c. That is, the second area 11b is sandwiched between the first area 11a and the third area 11c.

A first MOSFET (hereinafter called "MOS1") is formed in the first area 11a and the third area 11c. That is, the MOS1 is divided into two areas. A second MOSFET (hereinafter called "MOS2"), which is different from the first MOSFET, is formed in the second area 11b. That is, the MOS2 is disposed so as to be sandwiched between the MOS1 divided into two areas.

Two source pads S1 are provided in each of the first area 11a and the third area 11c. These source pads S1 are electrically connected to the MOS1. A gate pad G1, which is electrically connected to the MOS1, is provided between the two source pads S1 in each of the first area 11a and the third area 11c.

Two source pads S2, which are electrically connected to the MOS2, are provided in the second area 11b. A gate pad G2, which is electrically connected to the MOS2, is provided between the two source pads S2. The gate pads G1 and G2 are connected to respective gate lines 12. The gate line 12 is disposed so as to surround each of the MOS1, which is divided into the two areas, and the MOS2.

Figure 2:
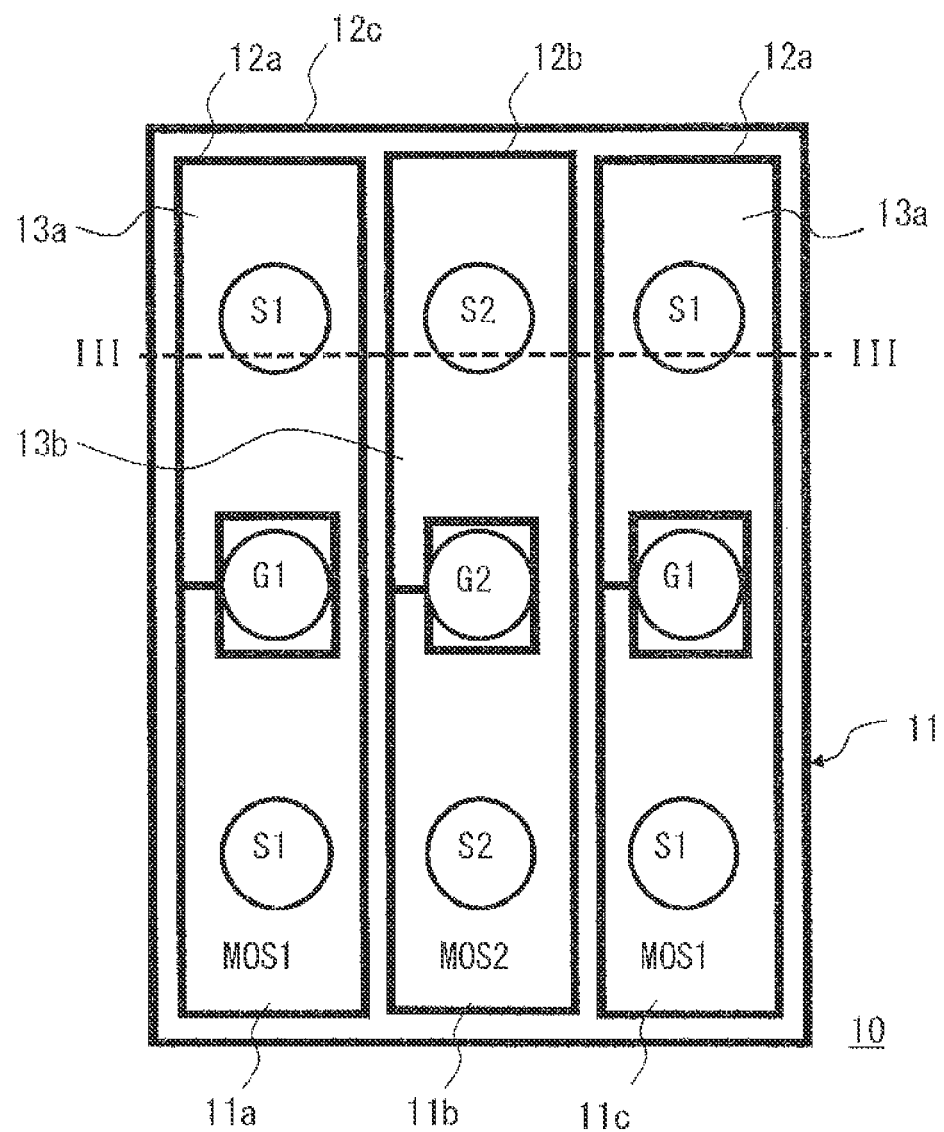
FIG. 2 shows a configuration example of a gate line of a semiconductor device shown in FIG. 1.

FIG. 2 shows an example of a configuration of the gate line of the semiconductor device according to the first embodiment shown in FIG. 1. The gate line 12 includes first gate lines 12a, a second gate line 12b, and an EQR (EQui-potential Ring) line 12c.

The first gate lines 12a are ring-shaped lines each of which surrounds a respective one of the first area 11a and the third area 11c. The gate pad G1 of each of the first area 11a and the third area 11c is connected to a respective one of the first gate lines 12a. Each of the gate pads G1 is wired to a peripheral area of the chip 11 by the respective first gate line 12a.

The second gate line 12b is a ring-shaped line that surrounds the second area 11b. The gate pad G2 is connected to the second gate line 12b. The gate pad G2 is wired to a peripheral area of the chip 11 by the second gate line 12b. The first gate line 12a and the second gate line 12b are provided in order to reduce the gate resistance and are also called "gate fingers".

The EQR line 12c is a ring-shaped line that is disposed so as to surround all of the first area 11a, the second area 11b, and the third area 11c. By maintaining the EQR line 12c at a drain potential, the spreading of the depletion layer is suppressed so that the depletion layer does not reach the edge of the chip, and thus making it possible to maintain the withstand voltage at the chip edge. Note that the EQR line 12c does not control either the MOS1 or MOS2 to turn on/off. As such, if the withstand voltage is sufficient, the EQR line 12c may be omitted.

In each of the first area 11a and the third area 11c, a first source electrode 13a is provided in a layer located below the source pads S1. In the second area 11b, a second source electrode 13b is provided in a layer located below the source pads S2.

Each of the first gate lines 12a, the second gate line 12b, the EQR line 12c, the first source electrode 13a, the second source electrode 13b, and the like is an aluminum line layer and is formed by sputtering, plating, CVD, or a similar technique. Note that a metal or an alloy having a lower resistance than aluminum such as Cu, or a semiconductor such as a polysilicon that is doped with an impurity at a high concentration can be used as a substitute for the aluminum line layer. The pad portions including the source pads S1 and S2 and the gate pads G1 and G2 may be formed by plating or a similar technique.

Figure 3:
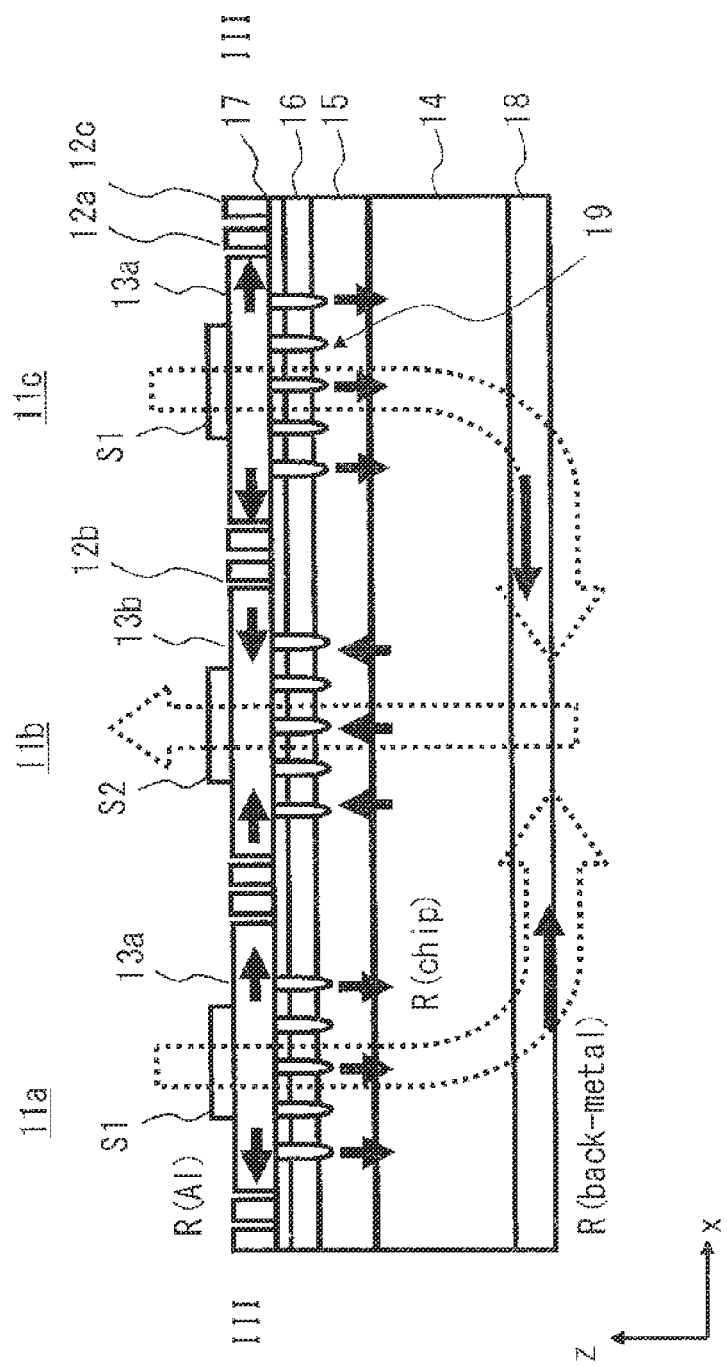
FIG. 3 is a schematic diagram showing a structure example and a current path in a cross section taken along a line III-III in FIG. 2.

A drain electrode (which is not shown in FIGS. 1 and 2) is provided on the back surface of the chip 11. This drain electrode is used for both the MOS1 and the MOS2. A cross-sectional structure of the semiconductor device 10 and an inter-source electrode resistance RSS (on) are explained hereinafter with reference to FIG. 3. FIG. 3 is a schematic diagram showing an example of a device structure and a current path in a cross section taken along a line III-III in FIG. 2.

As shown in FIG. 3, the semiconductor device 10 further includes a semiconductor substrate 14, an epitaxial layer 15, a second conductive type diffusion layer 16, a first conductive type diffusion layer 17, a drain electrode 18, and a vertical transistor structure 19.

The semiconductor substrate 14 is, for example, a semiconductor substrate typically made of Si. The semiconductor substrate 14 is formed by crystal growth. However, the semiconductor substrate 14 is not limited to the semiconductor substrate made of Si. That is, the semiconductor substrate 14 may be made from a compound semiconductor such as GaN, SiC, InP and GaAs or may be made from their solid solution.

On the front surface of the first conductive type semiconductor substrate 14, the first conductive type epitaxial layer 15, the second conductive type diffusion layer 16, and the first conductive type diffusion layer 17 are successively stacked in the z-direction. Note that when the first conductive type is an n-layer, the second conductive type is a p-layer, or vice-versa.

The epitaxial layer 15 is formed together with crystal growth by using diffusion, ion implantation, or a similar technique. Each of the second conductive type diffusion layer 16 and the first conductive type diffusion layer 17 is formed by ion implantation or diffusion into the epitaxial layer 15, or by a similar technique.

In the first conductive type diffusion layer 17, the second conductive type diffusion layer 16, and the epitaxial layer 15, a plurality of gate trenches that extend from the first conductive type diffusion layer 17 to the epitaxial layer 15 are formed. Further, the vertical transistor structure 19 is formed in this area.

In the gate trench, a gate insulating film, a gate electrode typically made of polysilicon or the like, and an inter-layer insulating film are formed (not shown). Further, the first conductive type diffusion layer 17 serves as a source region and the second conductive type diffusion layer 16 serves a channel region (also called "base region"). Further, the first conductive type semiconductor substrate 14 and the epitaxial layer 15 serve as a drain region.

In each of the first area 11a and the third area 11c, the above-described first source electrode 13a is formed above the area of the first conductive type diffusion layer 17 where the vertical transistor structure 19 is formed. In the second area 11b, the second source electrode 13b is formed above the area of the first conductive type diffusion layer 17 where the vertical transistor structure 19 is formed.

The source pad S1 is formed above the first source electrode 13a and the source pad S2 is formed above the second source electrode 13b. The drain electrode 18 such as a metal film is disposed on the back-surface side of the semiconductor substrate 14.

The first gate lines 12a are disposed outside the first source electrodes 13a, respectively. The EQR line 12c is arranged outermost side of the chip. The second gate line 12b and the first gate line 12a are disposed between the first source electrode 13a and the second source electrode 13b. The second gate line 12b and the first gate line 12a are arranged in this order as viewed from the second source electrode 13b.

In FIG. 3, as indicated by arrows drawn by broken lines, a current path is formed in such a manner that a current flows from the source pads S1 toward the source pad S2 through the drain electrode 18 disposed on the back surface. The inter-source electrode resistance RSS(on) includes an Al spreading resistance R(Al) in the first and second source electrodes 13a and 13b, a chip resistance R(chip) of the chip 11 including the vertical transistor structure 19 and the like, and a back-surface resistance R(back-metal) in the drain electrode 18.

The drain electrode 18 preferably comprises a Ti—Ag or Ti—Ni—Ag metal stacked structure, or a Ti—Au or Ti—Ni—Au metal stacked structure. In particular, since the back-surface metal resistance significantly affects the RSS (on) in the MOSFET according to an embodiment, the sheet resistance of the back-surface metal structure is preferably equal to or less than 50 mΩ/sq. More preferably, the sheet resistance is equal to or less than 30 mΩ/sq.

Note that the vertical transistor structure 19 may be a UMOS (U-shape Metal-Oxide-Semiconductor) structure or a DMOS (Double-Diffused Metal-Oxide Semiconductor) structure, which has a structure that allows a current to flow in the direction perpendicular to the first source electrode 13a and the second source electrode 13b disposed on the front surface of the chip, and the drain electrode 18 disposed on the back surface.

As described above, the MOS2 is disposed between two divided areas of the MOS1 in the first embodiment. With the configuration like this, as indicated by the arrows drawn by broken lines in FIG. 3, the current flow direction is the x-direction along the short-side, i.e., the direction from the respective source pads S1 toward the source pad S2. Further, the width of the current flow is in the direction (y-direction) in which each area (first area 11a, second area 11b, and third area 11c) extends.

As a result, it is unnecessary to change the chip shape in order to increase the overall aspect ratio of the chip. Further, it is possible to increase the substantial aspect ratio and to reduce the inter-source electrode resistance RSS(on), in particular, the back-surface resistance R(back-metal).

In general, in one-chip dual type semiconductor devices, the size of the MOS1 is equal to the size of the MOS2 in order to balance the driving capability of each MOSFET. However, in the first embodiment, while two gate pads G1 are disposed in the MOS1, only one gate pad G2 is disposed in the MOS2.

Since the area where a gate pad is disposed is an ineffective area as an active cell, the driving capability of the MOS2 becomes larger than that of the MOS1. Further, when compared to a one-chip dual type semiconductor device having one MOS1 and one MOS2 in the same chip size, the average diffusion path of the current that diffuses in the x-direction can be reduced because the source electrode area is divided in the x-direction as described below. Therefore, the driving capability of the MOS2 improves.

Figure 4:
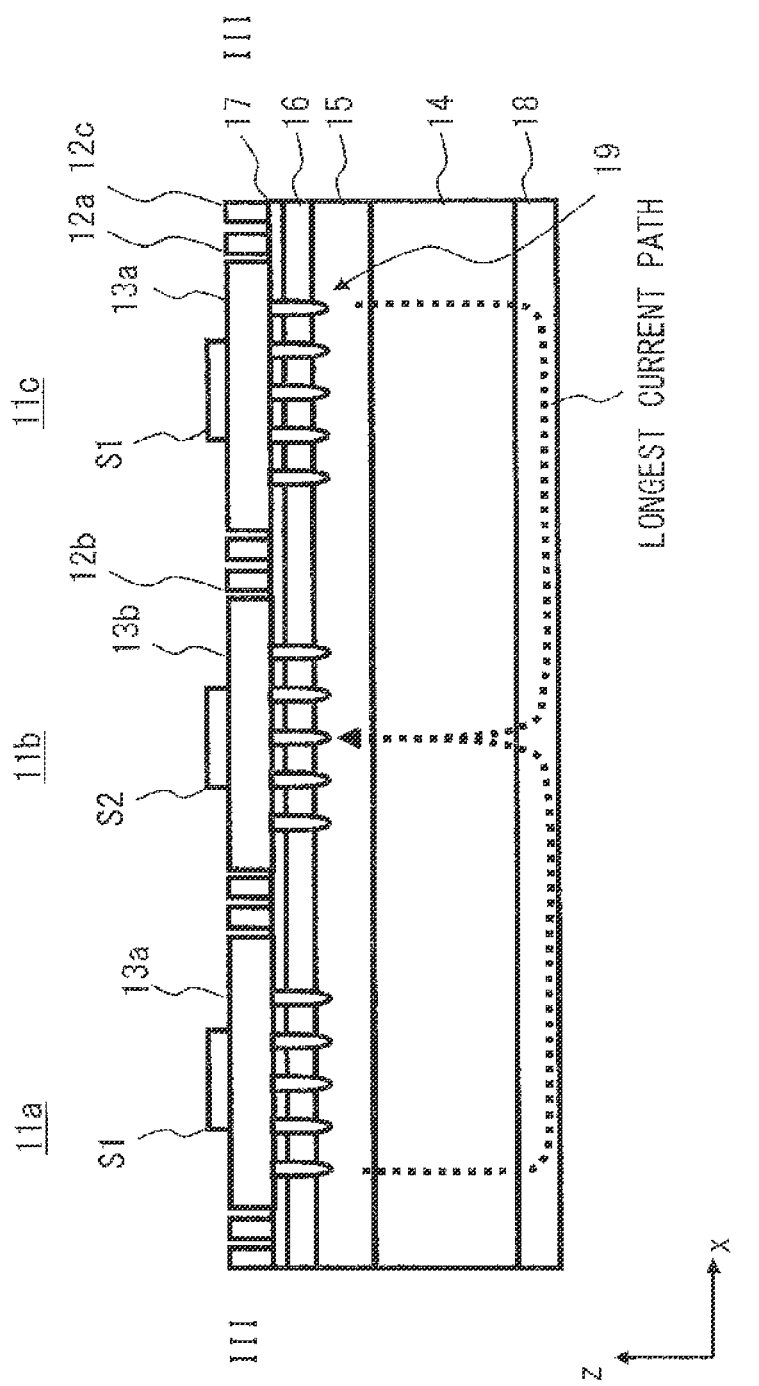
FIG. 4 is a schematic diagram showing a current path in a semiconductor device according to the first embodiment.
Figure 22:
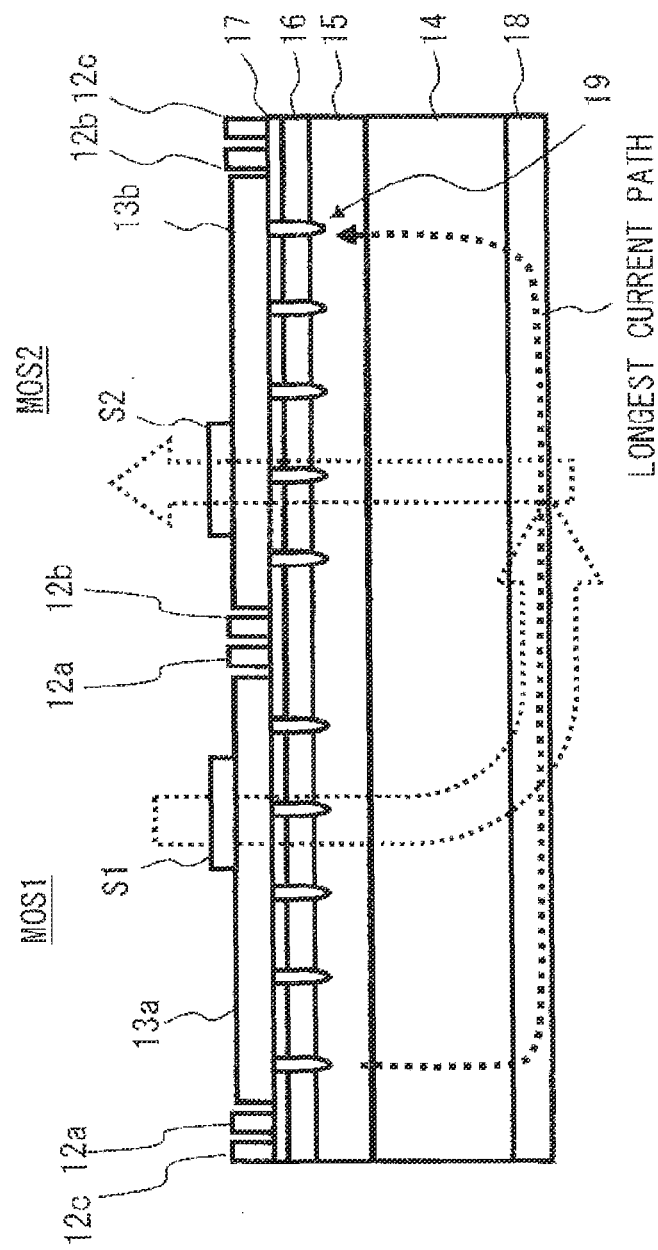
FIG. 22 is a schematic diagram showing a current path in the comparative example shown in FIG. 21.

FIG. 4 is a schematic diagram of the longest current path in the arrangement of MOS1/MOS2/MOS1 shown in FIG. 3. Further, FIG. 22 shows a schematic diagram of the longest current path in a comparative example in which a chip is divided into two areas and the divided areas are used as a MOS1 and a MOS2 respectively. In FIG. 22, the same symbols are assigned to the same components as those in FIG. 4. The longest current path is indicated by a bold broken-line arrow in each of FIGS. 4 and 22.

As shown in FIG. 4, since a current flows from the MOS1 located on both sides into the central MOS2 in the arrangement of MOS1/MOS2/MOS1, the longest current path has a distance from the end on the chip-edge side of the MOS1 to the center of the MOS2.

In contrast to this, in the arrangement of MOS1/MOS2 in the comparative example in FIG. 22, the longest current path has a distance from the end on the chip-edge side of the MOS1 to the end on the chip-edge side of the MOS2. Therefore, the longest current path of the comparative example is longer than that of the arrangement according to the first embodiment. That is, in the arrangement of MOS1/MOS2 in the comparative example, a loss resulting from the increase in the longest current path occurs even when the overall aspect ratio of the chip is increased.

Therefore, in the first embodiment, it is possible to make the size of the MOS2 smaller than the total size of the MOS1 in order to balance the driving capabilities of the MOS1 and the MOS2. That is, the total size of the MOS1 is larger than the size of the MOS2. As a result, the chip size can be reduced even further.

Further, since a gate pad is disposed in each area, each MOS can be individually controlled. Further, the gate pad G1 is disposed between two source pads S1 and the gate pad G2 is disposed between two source pads S2. That is, since the gate pads G1 and G2 are disposed at the center, it is possible to reduce occurrences of defective connection due to a physical stress caused by the bending of the chip 11 and thereby to reduce occurrences of malfunctions.

Incidentally, when the chip is further partitioned, for example, partitioned into four areas and transistors are thereby arranged as "MOS1/MOS2/MOS1/MOS2", the longest current path becomes shorter than that in the case where the chip is partitioned into three areas as "MOS1/MOS2/MOS1", provided that they have the same chip size. Therefore, it is presumed that the loss resulting from the length of the longest current path is reduced in the case of the division into four areas in comparison to the case of the division into three areas.

However, while the number of element isolation regions between the MOS1 and the MOS2 (i.e., ineffective areas) is two in the case of the division into three areas, the number of element isolation areas is three in the case of the division into four areas. Therefore, the ratio of the effective cell area decreases in the division into four areas in comparison to the division into three areas. Therefore, when the chip size is the same, the driving capability is smaller in the division into four areas in comparison to the division into three areas.

The length of the longest current path and the ratio of the effective cell area are in a trade-off relation with respect to the division number. The smaller the chip size becomes, the larger the effect against the driving capability by the effective cell area becomes in comparison to the effect against the driving capability by the length of the longest current path. That is, the smaller the chip size becomes, the larger the driving capability becomes in the division into three areas in comparison to the driving ability in the division into four areas.

Further, in the case of the division into four areas, it is necessary to dispose a source pad for each of MOS1/MOS2/MOS1/MOS2. As a result, four source pads are arranged in a row along one direction. The smaller the chip size becomes, the smaller the size of the source pad becomes. Therefore, pads and lines on the circuit board side also need to be reduced in size. As a result, mounting a chip on a circuit board becomes more difficult in comparison to the division into three areas. Further, since the total number of pads increases in the division into four areas in comparison to the division into three sections, there is a concern that the frequency of occurrences of defective pad connection increases. Therefore, the division into three areas is better than the division into four sections in terms of the packaging easiness, the productivity, and the cost. As described above, the division into three areas is better than the division into two areas or the division into four areas.

Second Embodiment

Figure 5:
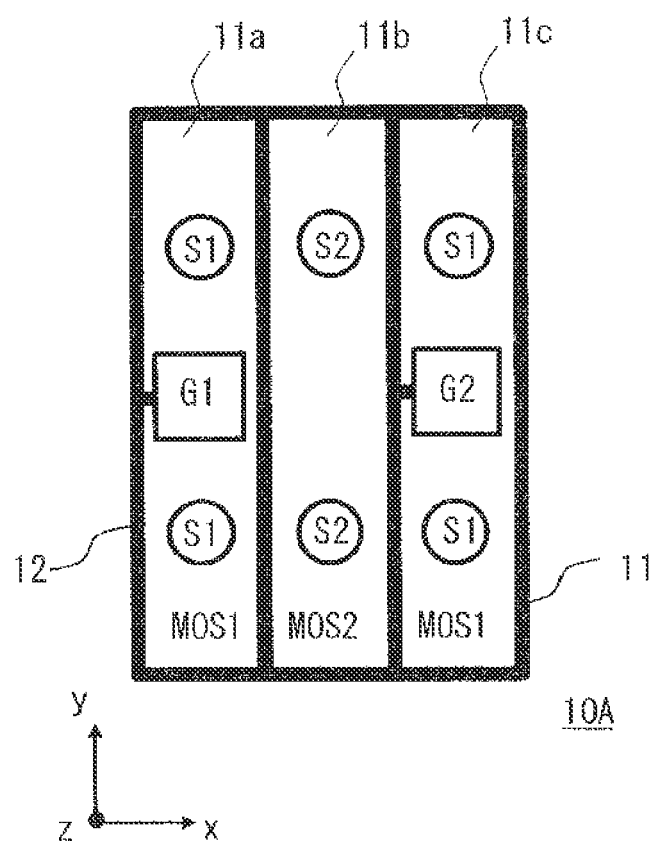
FIG. 5 shows a configuration of a semiconductor device according to a second embodiment.

A configuration of a semiconductor device according to a second embodiment is explained hereinafter with reference to FIG. 5. FIG. 5 shows a configuration of a semiconductor device 10A according to a second embodiment. In FIG. 5, the same symbols are assigned to the same components as those in the above descriptions and their explanations are omitted as appropriate.

In a semiconductor device according to this embodiment, two MOSFETs, i.e., a first MOSFET MOS1 and a second MOSFET MOS2 are packed. Therefore, at least two gate pads are required to drive these MOSFETs. In the first embodiment, an example in which a gate pad is disposed in every partitioned area is explained.

However, since the areas where gate pads are disposed become ineffective areas for the inter-source electrode resistance RSS(on), it is desirable to reduce the number of gates pads. Therefore, the inventors of the present application have devised a technique for reducing the number of gate pads. In a second embodiment, one of the gate pads G1 that drive the MOS1, which is divided into two areas, is removed. Further, the gate pad G2 that drives the MOS2 is disposed in the area where the gate pad G1 is removed.

As shown in FIG. 5, similarly to the first embodiment, a chip 11 is partitioned into three areas including a first area 11a, a second area 11b, and a third area 11c. Further, the second area 11b is disposed between the first area 11a and the third area 11c. A MOS1 is formed in the first area 11a and the third area 11c, and a MOS2 is formed in the second area 11b.

In the first area 11a, a gate pad G1, which is electrically connected to the MOS1, is disposed between two source pads S1. In the third area 11c, a gate pad G2, which is electrically connected to the MOS2, is disposed between the two source pads S1. That is, the gate pads G1 and G2 are arranged so as to be opposed with the second area 11b interposed therebetween. In the second area 11b, no gate pad is disposed between two source pads S2.

By disposing the gate pads G1 and G2 in the first area 11a and the third area 11c, respectively, which are disposed outside the second area 11b, as described above, it is possible to make the packaging easier. Further, by symmetrically disposing the gate pads G1 and G2 and the source pads S1 with respect to the center line of the chip 11 (center line of the second area 11b), it is possible to reduce the physical stress caused by the bending or the like when the chip is mounted and thereby to ensure the packaging reliability.

Figure 6:
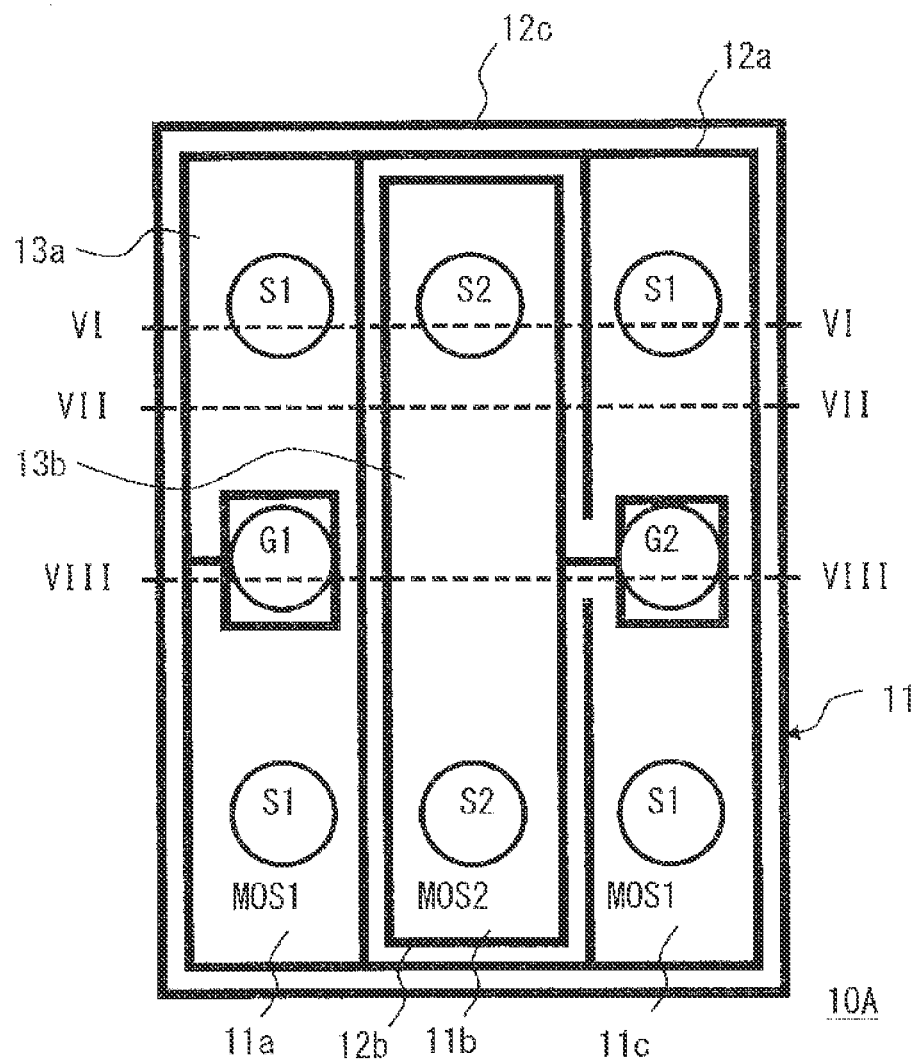
FIG. 6 shows a configuration example of a gate line of a semiconductor device shown in FIG. 5.

A configuration of a gate line(s) of the semiconductor device according to the second embodiment shown in FIG. 5 is explained hereinafter with reference to FIG. 6. FIG. 6 shows an example of a configuration of a gate line(s) of the semiconductor device 10A according to the second embodiment. As shown in FIG. 6, a second gate line 12b is disposed so as to surround the second area 11b. The gate pad G2 disposed in the third area 11c is connected to the second gate line 12b.

A gate line 12a is disposed so as to surround each of the first area 11a and the third area 11c. Further, the first gate line 12a extends, in the second area 11b, from the first area 11a to the third area 11c in an area outside the second gate line 12b.

That is, the first gate line 12a surrounding the first area 11a is connected to the first gate line 12a surrounding the third area 11c in an area outside the second gate line 12b. Therefore, the second gate line 12b is surrounded by the first gate line 12a. Note that a part of the first gate line 12a that is disposed so as to surround the third area 11c is opened.

In this opened part, a line connecting the second gate line 12b with the gate pad G2 is formed. The gate pad G1 disposed in the first area 11a is connected to the first gate line 12a. An EQR line 12c is disposed so as to surround all of the first area 11a, the second area 11b, and the third area 11c. Nevertheless, if the withstand voltage is sufficient, the EQR line 12c may be omitted.

Figure 7:
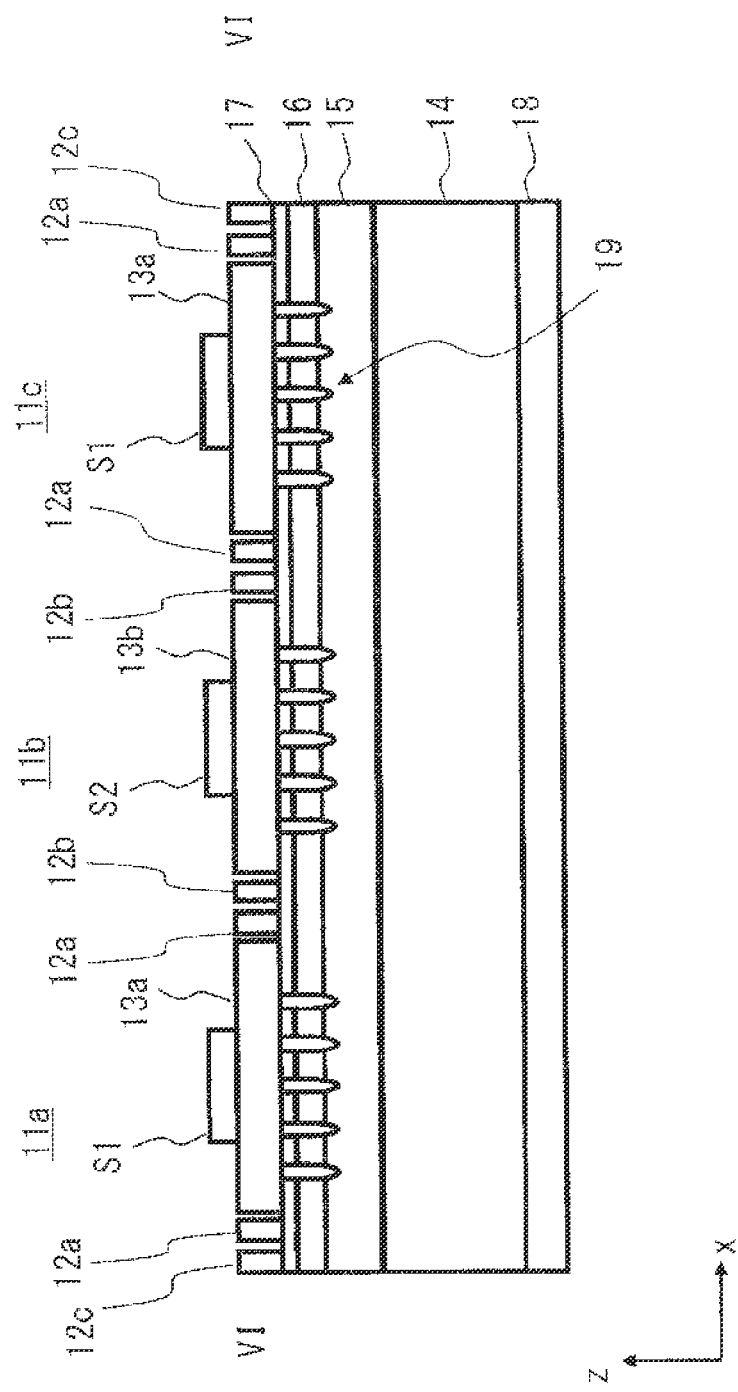
FIG. 7 is a cross section taken along a line VI-VI in FIG. 5.
Figure 8:
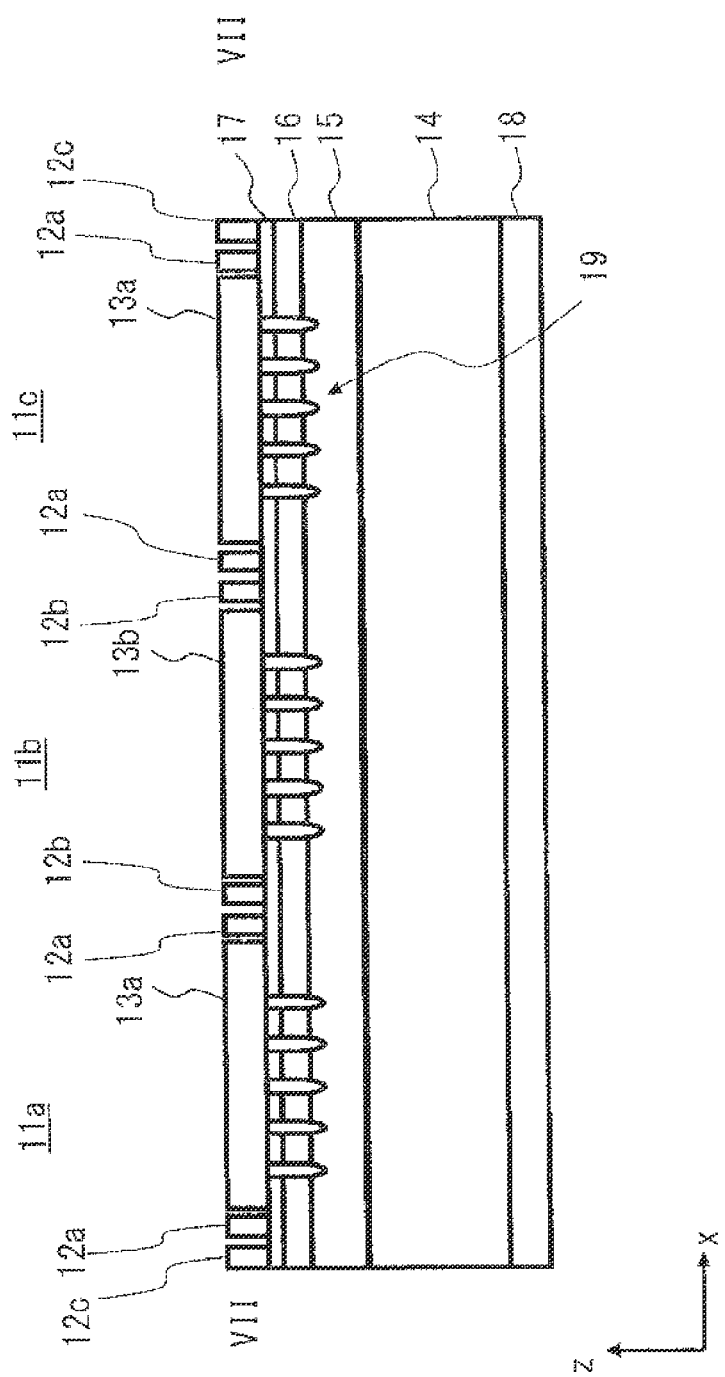
FIG. 8 is a cross section taken along a line VII-VII in FIG. 5.
Figure 9:
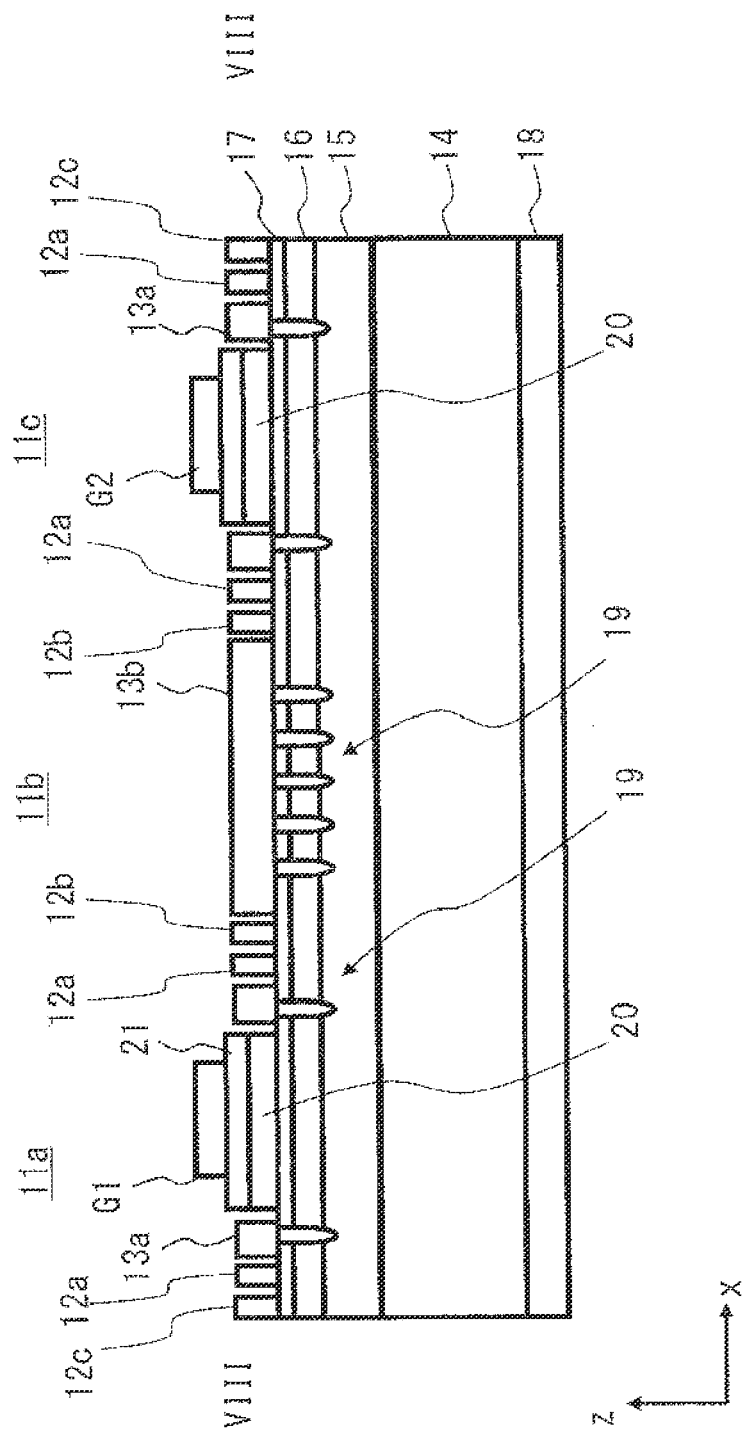
FIG. 9 is a cross section taken along a line VIII-VIII in FIG. 5.

A cross-sectional structure of the semiconductor device 10A is explained hereinafter with reference to FIGS. 7 to 9. FIGS. 7 to 9 are a VI-VI cross section, a VII-VII cross section, and a VIII-VIII cross section, respectively, of FIG. 6 Note that since FIG. 7 is a cross section of an area in which the source pads S1 and S2 are disposed and is the same as FIG. 3, its explanation is omitted.

FIG. 8 is a cross section of an area in which, in each area, any of the source pads S1 and S2 and the gate pads G1 and G2 is not disposed. The source pads S1 and S2 shown in FIG. 6 are not disposed above the first source electrode 13a and the second source electrode 13b. The other configuration is similar to that shown in FIG. 3, and therefore its explanation is omitted.

FIG. 9 is a cross section of an area in which gate pads G1 and G2 are disposed. As shown in FIG. 9, in the first area 11a, a stacked body comprising an oxide film 20, a gate electrode 21, and a gage pad G1 is disposed between the first source electrodes 13a. Meanwhile, in the third area 11c, a stacked body comprising an oxide film 20, a gate electrode 21, and a gage pad G2 is disposed between the first source electrodes 13a. In these areas, vertical transistor structures 19 are provided in a layer located below the first source electrodes 13a. In the second area 11b, a second source electrode 13b is provided in a layer located above the area of the first conductive type diffusion layer 17 where vertical transistor structures 19 are provided.

In the second embodiment, similarly to the first embodiment, the MOS2 is disposed between the two divided areas of the MOS1. As a result, it is possible to increase the substantial aspect ratio and to reduce the inter-source electrode resistance RSS(on). Further, in the second embodiment, the gate pad G1 for driving the MOS1 is disposed in one of the divided areas of the MOS1 and the gate pad G2 for driving the MOS2 is disposed in the other of the divided areas of the MOS1.

In this way, although the MOS1 is divided into two areas and thus there are three areas in total in the chip 11, the number of gate pads can be reduced to two. In this way, it is possible to reduce the area in which a gate pad(s) is disposed and thereby to reduce the inter-source electrode resistance RSS(on) even further.

In general, in one-chip dual type semiconductor devices, the size of the MOS1 is equal to the size of the MOS2 in order to balance the driving capability of each MOS. However, in this embodiment, while two gage pads (gate pads G1 and G2) are disposed in the first area 11a and the third area 11c which constitute the MOS1, no gate pad is disposed in the second area 11b which constitutes the MOS2.

Since the area where a gate pad is disposed is an ineffective area as an active cell, the driving capability of the MOS2 becomes larger than that of the MOS1. Further, when compared to a one-chip dual type semiconductor device having one MOS1 and one MOS2 in the same chip size, the average diffusion path of the current that diffuses in the x-direction can be reduced because the source electrode area is divided in the x-direction. Therefore, the driving capability of the MOS2 improves. Therefore, it is possible to make the size of the MOS2 smaller than the total size of the MOS1 in order to balance the driving capabilities of the MOS1 and the MOS2. That is, the total size of the MOS1 is larger than the size of the MOS2.

Further, in the first area 11a, the gate pad G1 is disposed between two source pads S1, and in the third area 11c, the gate pad G2 is disposed between two source pads S1. That is, since the gate pads G1 and G2 are disposed at the center, it is possible to reduce occurrences of defective connection due to a physical stress caused by the bending of the chip 11 and thereby to reduce occurrences of malfunctions.

Further, by disposing the gate pad G2 of the MOS2 sandwiched between two MOS1s in the area of the MOS1 located outside the MOS2, all the pads, i.e., the source pads S1 and S2 and the gate pads G1 and G2 can be disposed in the peripheral area of the chip. As a result, a layout of lines on the circuit board side becomes easier than that for the pad arrangement in the first embodiment.

That is, in the first embodiment, the line for the central gate pad G2 wired on the circuit board side needs to be wired so as to pass between two pads or needs to be wired by using multiple-layer wiring. In contrast to this, in this embodiment, since all the pads are arranged in the peripheral area of the chip, the lines on the circuit board side can be disposed outside the chip. Therefore, a layout using single-layer wiring can be easily made.

Another example of a semiconductor device according to a second embodiment is explained hereinafter with reference to FIG. 10. In a semiconductor device 10B shown in FIG. 10, an additional source pad S2 is disposed between the two source pads S2 in the second area 11b. This source pad S2 is disposed between the gate pads G1 and G2. The other configuration is similar to that in the example shown in FIG. 6, and therefore its explanation is omitted. Since the additional source pad S2 can be disposed in the space between the gate pads G1 and G2 for the MOS2, the inter-source electrode resistance RSS(on) can be reduced even further.

Further, in the central MOS2, a plurality of source pads S2 are arranged in a row in the longitudinal direction. These source pads S2 are at the same potential. That is, since only one line needs to be disposed along the longitudinal direction of the MOS2 in the circuit board in order to connect the plurality of source pads S2, a layout using single-layer wiring can be easily made as in the case of FIGS. 5 and 6.

Third Embodiment

Figure 11:
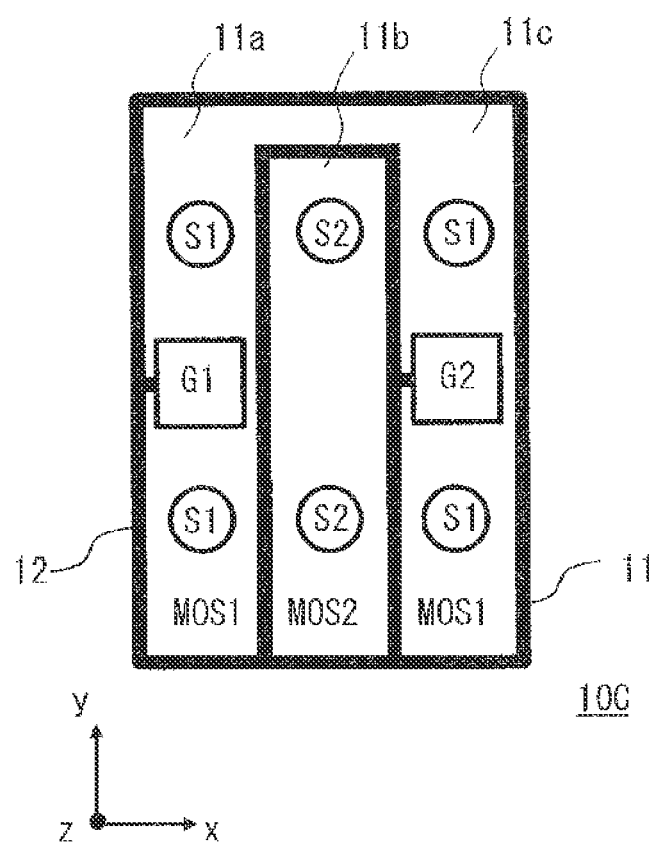
FIG. 11 shows a configuration of a semiconductor device according to a third embodiment.

A configuration of a semiconductor device according to a third embodiment is explained hereinafter with reference to FIG. 11. FIG. 11 shows a configuration of a semiconductor device 10C according to a third embodiment. The semiconductor device 10C according to the third embodiment is different from the semiconductor device 10A according to the second embodiment in that the first area 11a and the third area 11c are partially connected. In FIG. 11, the same symbols are assigned to the same components as those in the above descriptions and their explanations are omitted as appropriate.

As shown in FIG. 11, the first area 11a, the second area 11b, and the third area 11c are disposed in this order in such a manner that their long sides are aligned. The first area 11a and the third area 11c are connected with each other on one of the short-side sides of the semiconductor device 10C. That is, the first source electrode 13a disposed in the MOS1 is continuously formed from the first area 11a to the third area 11c. That is, the MOS1 is formed in a U-shape and the MOS2 is formed inside the U-shape in plan view.

Figure 12:
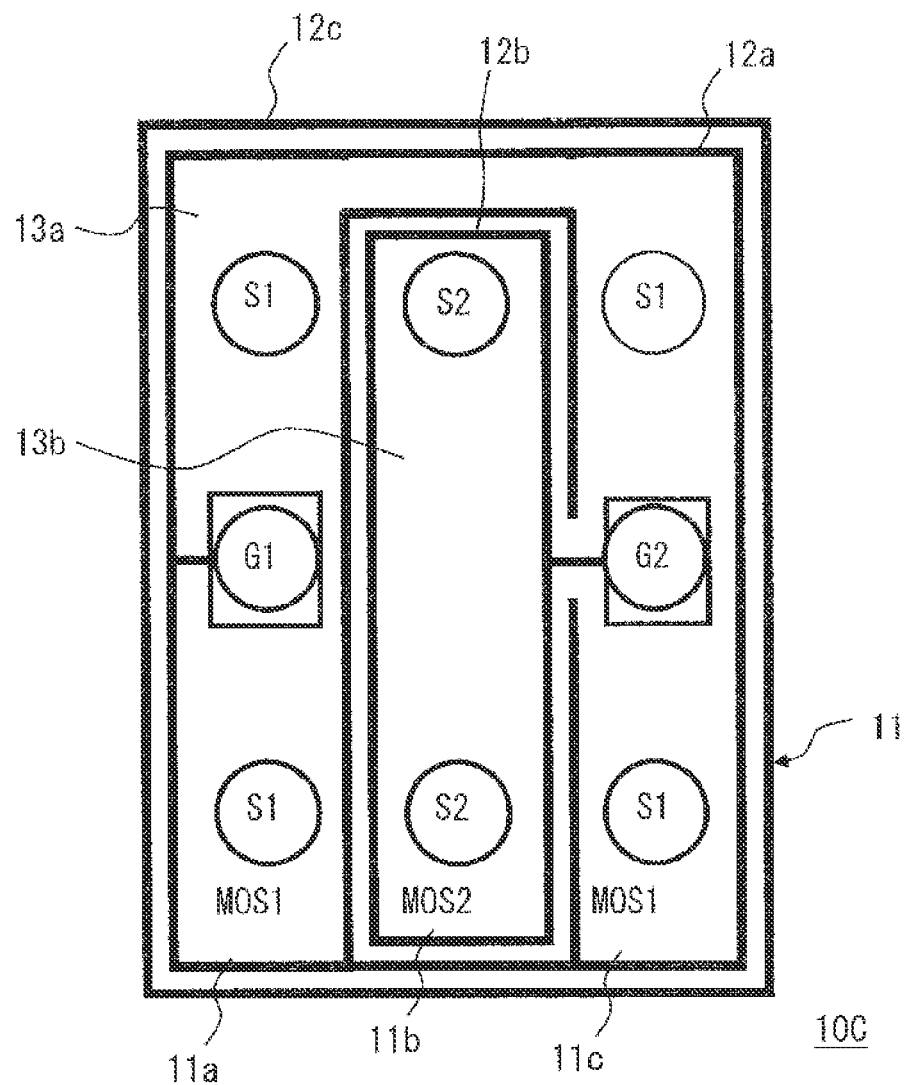
FIG. 12 shows a configuration example of a gate line of a semiconductor device shown in FIG. 11.

A configuration of a gate line(s) of the semiconductor device according to the third embodiment shown in FIG. 11 is explained hereinafter with reference to FIG. 12. FIG. 12 shows an example of a configuration of a gate line(s) of the semiconductor device 10C according to the third embodiment. As shown in FIG. 12, the second gate line 12b is disposed so as to surround the second area 11b. The gate pad G2 disposed in the third area 11c is connected to the second gate line 12b.

The MOS1 is formed in a U-shape. The first gate line 12a is disposed along the border of the U-shaped MOS1. Further, on the opened side of the U-shape, the first gate line 12a extends from the first area 11a to the third area 11c outside the second gate line 12b. The second gate line 12b is surrounded by the first gate line 12a.

Note that a part of the first gate line 12a that is located between the second area 11b and the third area 11c is opened. In this opened part, a line connecting the second gate line 12b with the gate pad G2 is formed. The gate pad G1 disposed in the first area 11a is connected to the first gate line 12a.

The EQR line 12c is disposed so as to surround all of the first area 11a, the second area 11b, and the third area 11c. Therefore, in the second area 11b, the second gate line 12b, the first gate line 12a, and the EQR line 12c are disposed in this order from the second area 11b toward the peripheral area of the chip 11 on the opened side of the U-shape. Further, the second gate line 12b, two first gate lines 12a, and the EQR line 12c are disposed on the closed side of the U-shape. Nevertheless, if the withstand voltage is sufficient, the EQR line 12c may be omitted.

With this configuration, the length of the interface between the MOS1 and the MOS2 can be increased and thus the aspect ratio can be spuriously increased. Therefore, the back-surface resistance R(back-metal) can be reduced even further. Further, similarly to the second embodiment, since all the pads can be disposed in the peripheral area of the chip, the lines on the circuit board side can be disposed outside the chip. Therefore, a layout using single-layer wiring can be easily made.

Figure 10:
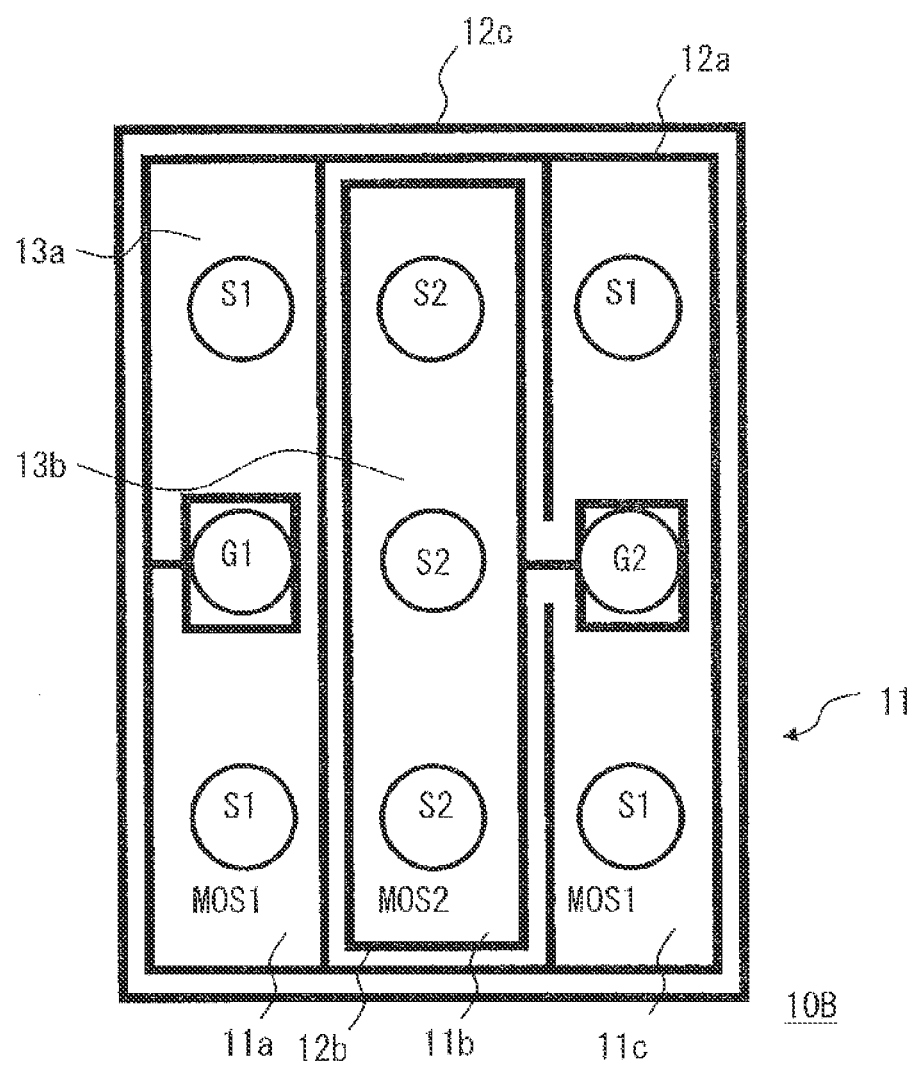
FIG. 10 shows another configuration example of a gate line of a semiconductor device according to a second embodiment.

Further, similarly to the MOS2 shown in FIG. 10, a third source pad S2 may also be disposed between the two source pads S2 in the MOS2 shown in FIG. 11 or 12. In this case, since only one line needs to be disposed along the longitudinal direction of the MOS2 in the circuit board in order to connect the plurality of source pads S2, a layout using single-layer wiring can be easily made as in the case of FIGS. 5 and 6.

Fourth Embodiment

Figure 13:
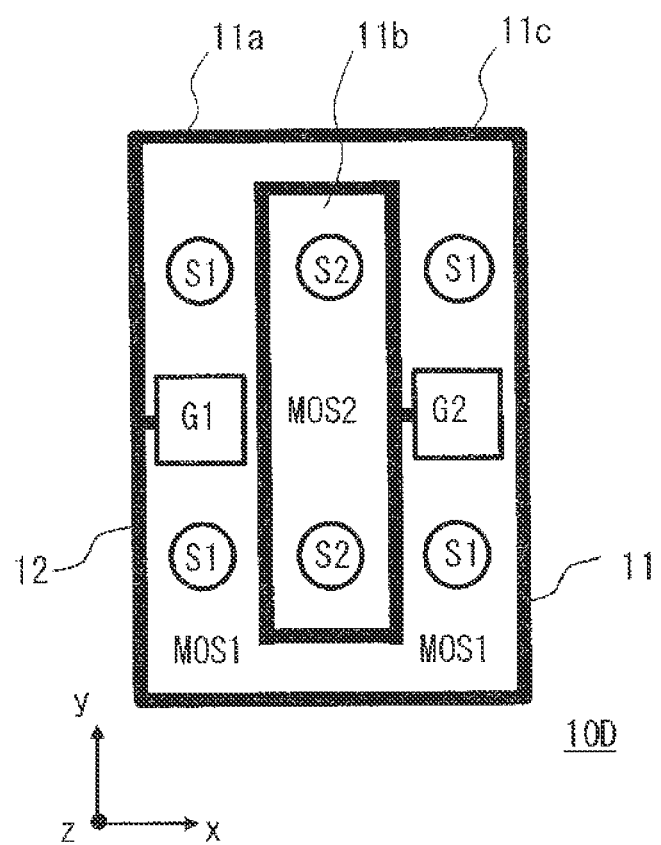
FIG. 13 shows a configuration of a semiconductor device according to a fourth embodiment.

A configuration of a semiconductor device according to a fourth embodiment is explained hereinafter with reference to FIG. 13. FIG. 13 shows a configuration of a semiconductor device 10D according to a fourth embodiment. The semiconductor device 10D is different from the semiconductor device 10C according to the third embodiment in that the first area 11a and the third area 11c are disposed so as to surround the second area 11b. In FIG. 13, the same symbols are assigned to the same components as those in the above descriptions and their explanations are omitted as appropriate.

As shown in FIG. 13, the first area 11a, the second area 11b, and the third area 11c are disposed in this order in such a manner that their long sides are aligned. The first area 11a and the third area 11c are connected with each other on both of the short-side sides of the semiconductor device 10D. That is, the first source electrode 13a disposed in the MOS1 is continuously formed from the first area 11a to the third area 11c. That is, in plan view, the MOS1 is formed in a rectangular frame shape and the MOS2 is formed inside the rectangular frame shape. That is, the MOS2 is completely surrounded by the MOS1.

Figure 14:
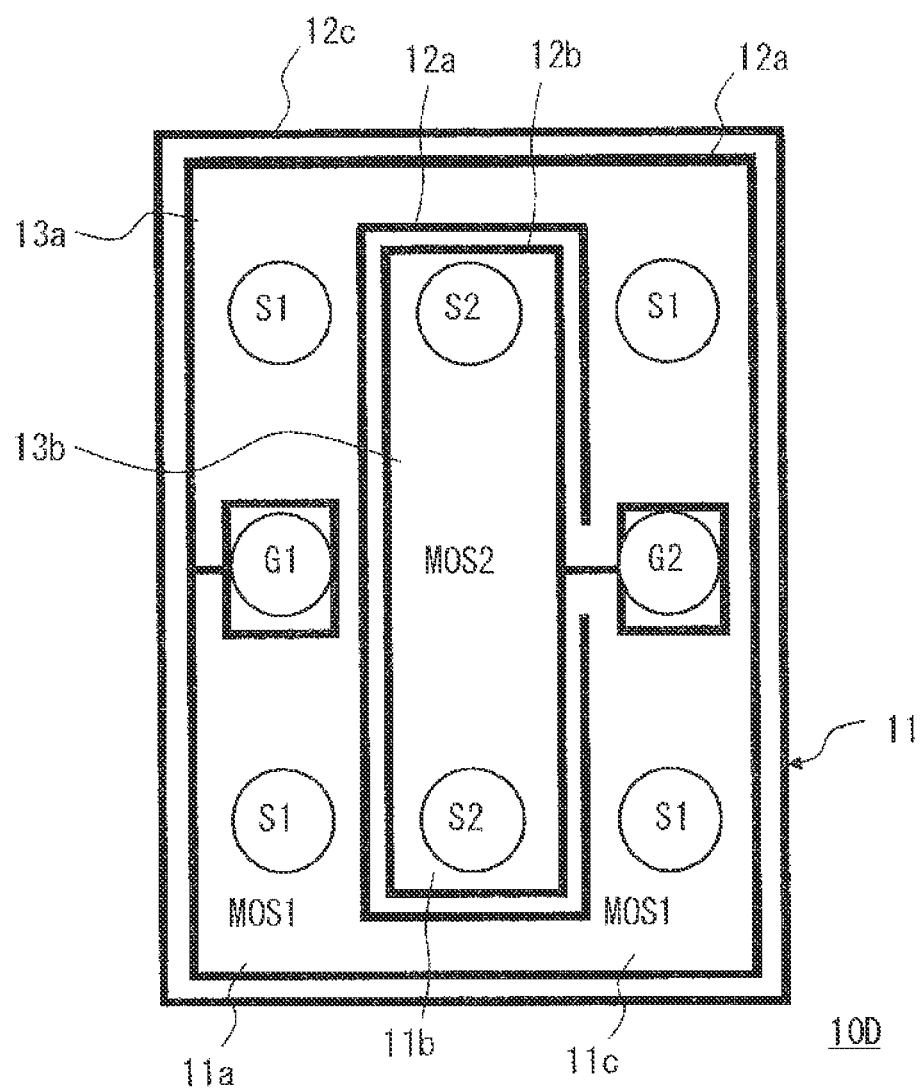
FIG. 14 shows a configuration example of a gate line of a semiconductor device shown in FIG. 13.

A configuration of a gate line(s) of the semiconductor device according to the fourth embodiment shown in FIG. 13 is explained hereinafter with reference to FIG. 14. FIG. 14 shows an example of a configuration of a gate line(s) of the semiconductor device 10D according to the fourth embodiment. As shown in FIG. 14, a second gate line 12b is disposed so as to surround the second area 11b. The gate pad G2 disposed in the third area 11c is connected to the second gate line 12b.

The MOS1 is formed in a rectangular frame shape. The first gate line 12a is disposed along the border of the rectangular frame shaped MOS1. Note that a part of the first gate line 12a that is located between the second area 11b and the third area 11c is opened. That is, the first gate line 12a includes one ring-shaped line and a partially ring-shaped line disposed inside the one ring-shaped line. In the opened part of the inner first gate line 12a, a line connecting the second gate line 12b with the gate pad G2 is formed. The gate pad G1 disposed in the first area 11a is connected to the first gate line 12a.

The outer first gate line 12a is electrically connected to the inner first gate line 12a through a gate electrode located in a gate trench (not shown). In other words, the ring-shaped first gate line 12a and the partially ring-shaped first gate line 12a are electrically connected with each other via the gate trench. With this arrangement, the source electrode of the MOS1 is not divided by the first gate line 12a and the second gate line 12b and thus can be formed as one source electrode.

The EQR line 12c is disposed so as to surround all of the first area 11a, the second area 11b, and the third area 11c. Therefore, in the semiconductor device 10D, the ring-shaped second gate line 12b, the partially ring-shaped line having the opened part, the ring-shaped first gate line 12a, and the ring-shaped EQR line 12c are disposed from the inner side to the outer side of the chip 11. Nevertheless, if the withstand voltage is sufficient, the EQR line 12c may be omitted.

With this configuration, the length of the interface between the MOS1 and the MOS2 can be increased even further in comparison to the third embodiment and thus the aspect ratio can be spuriously increased. Therefore, the back-surface resistance R(back-metal) can be reduced even further. Further, similarly to the second embodiment, since all the pads can be disposed in the peripheral area of the chip, the lines on the circuit board side can be disposed outside the chip. Therefore, a layout using single-layer wiring can be easily made.

Further, similarly to the MOS2 shown in FIG. 10, a third source pad S2 may also be disposed between the two source pads S2 in the MOS2 shown in FIG. 13 or 14. In this case, since only one line needs to be disposed along the longitudinal direction of the MOS2 in the circuit board in order to connect the plurality of source pads S2, a layout using single-layer wiring can be easily made as in the case of FIGS. 5 and 6.

Fifth Embodiment

Figure 15:
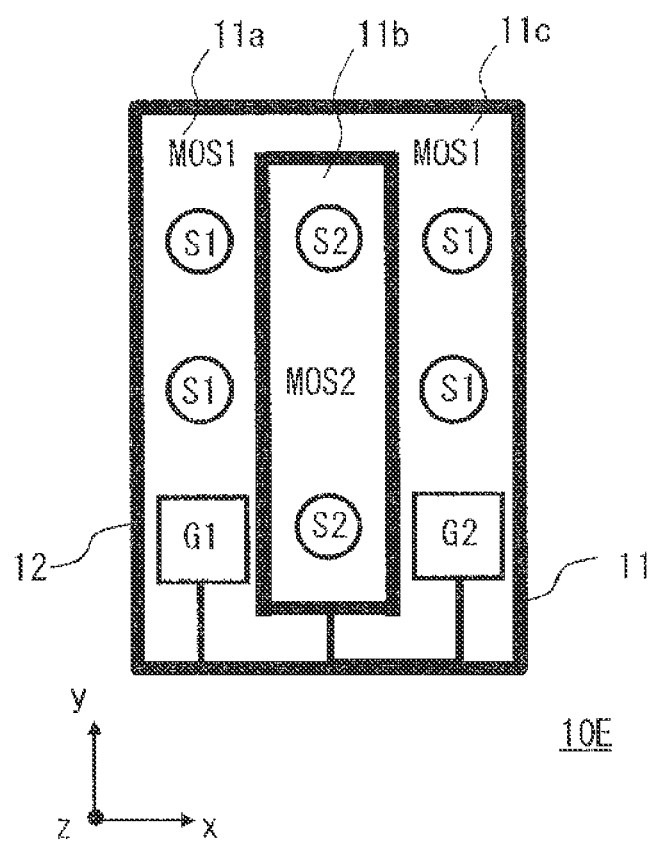
FIG. 15 shows a configuration of a semiconductor device according to a fifth embodiment.

A configuration of a semiconductor device according to a fifth embodiment is explained hereinafter with reference to FIG. 15. FIG. 15 shows a configuration of a semiconductor device 10E according to a fifth embodiment. The semiconductor device 10E is different from the semiconductor device 10D according to the fourth embodiment in the positions of the gate pads G1 and G2. In FIG. 15, the same symbols are assigned to the same components as those in the above descriptions and their explanations are omitted as appropriate.

In the semiconductor device 10E, the gate pad G1 is disposed near one of the short-side sides in the first area 11a. Further, in the third area 11c, the gate pad G2 is disposed on the side on which the gate pad G1 is disposed.

Two source pads are provided in each of the first area 11a and the third area 11c. In each area, the two source pads are arranged alongside each other. That is, in the first area 11a, one of the source pads S1 is disposed so as to be sandwiched between the gate pad G1 and the other source pad S1. Further, in the third area 11c, one of the source pads S1 is disposed so as to be sandwiched between the gate pad G2 and the other source pad S1. By forming both of the gate pads G1 and G2 near the same end of the chip in this manner, it is possible to make the packaging easier.

Figure 16:
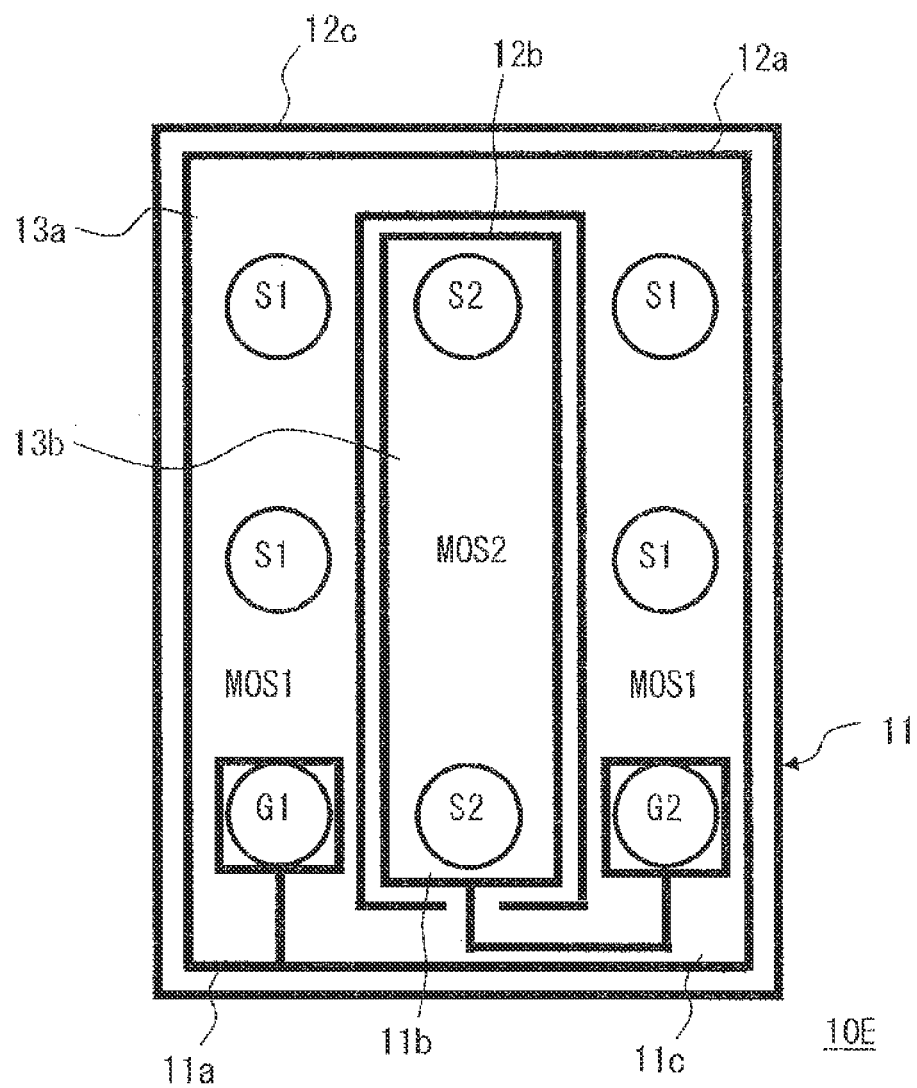
FIG. 16 shows a configuration example of a gate line of a semiconductor device shown in FIG. 15.

FIG. 16 shows an example of a configuration of a gate line(s) of the semiconductor device 10E according to the fifth embodiment shown in FIG. 15. As shown in FIG. 16, the configuration of the gate lines 12 in the semiconductor device 10E is roughly the same as that of the gate lines 12 in the semiconductor device 10D according to the fourth embodiment.

Note that in the example shown in FIG. 16, a part of the lower side of the first gate line 12a disposed between the second area 11b and the connecting portion between the first area 11a and the third area 11c is opened. In this opened part, a line connecting the second gate line 12b with the gate pad G2 is formed. The outer first gate line 12a is electrically connected to the inner first gate line 12a through a gate electrode located in a gate trench (not shown). With this configuration, the source electrode 13a of the MOS1 is not divided by the first gate lines 12a and the second gate line 12b, and thus can be formed as one source electrode.

With this arrangement, the length of the interface between the MOS1 and the MOS2 can be increased even further in comparison to the third embodiment. Therefore, the back-surface resistance R(back-metal) can be reduced even further. Further, similarly to the second embodiment, since all the pads can be disposed in the peripheral area of the chip, the lines on the circuit board side can be disposed outside the chip. Therefore, a layout using single-layer wiring can be easily made. Further, similarly to the MOS2 shown in FIG. 10, a third source pad S2 may also be disposed between the two source pads S2 in the MOS2 shown in FIG. 15 or 16. In this case, since only one line needs to be disposed along the longitudinal direction of the MOS2 in the circuit board in order to connect the plurality of source pads S2, a layout using single-layer wiring can be easily made as in the case of FIGS. 5 and 6.

Sixth Embodiment

Figure 17:
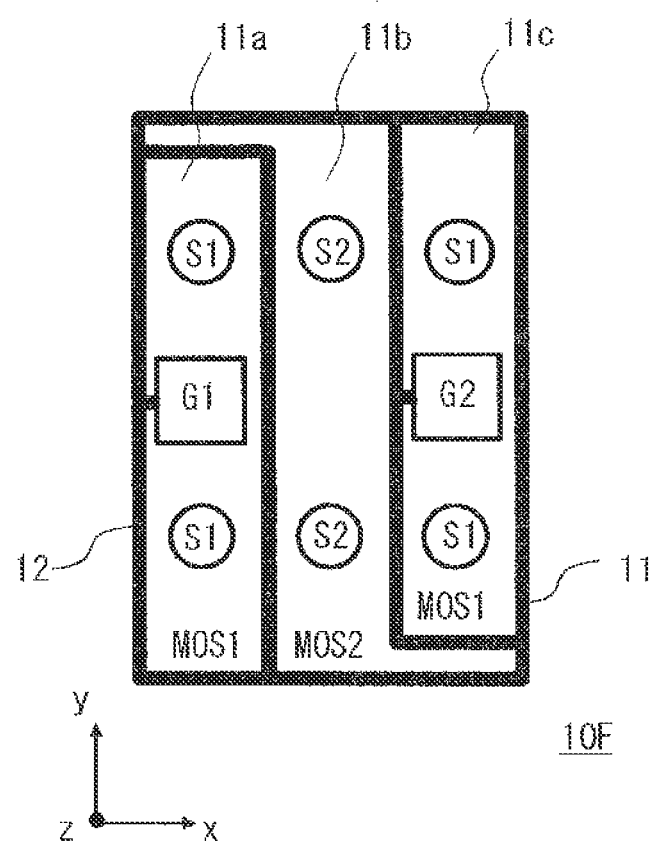
FIG. 17 shows a configuration of a semiconductor device according to a sixth embodiment.
Figure 18:
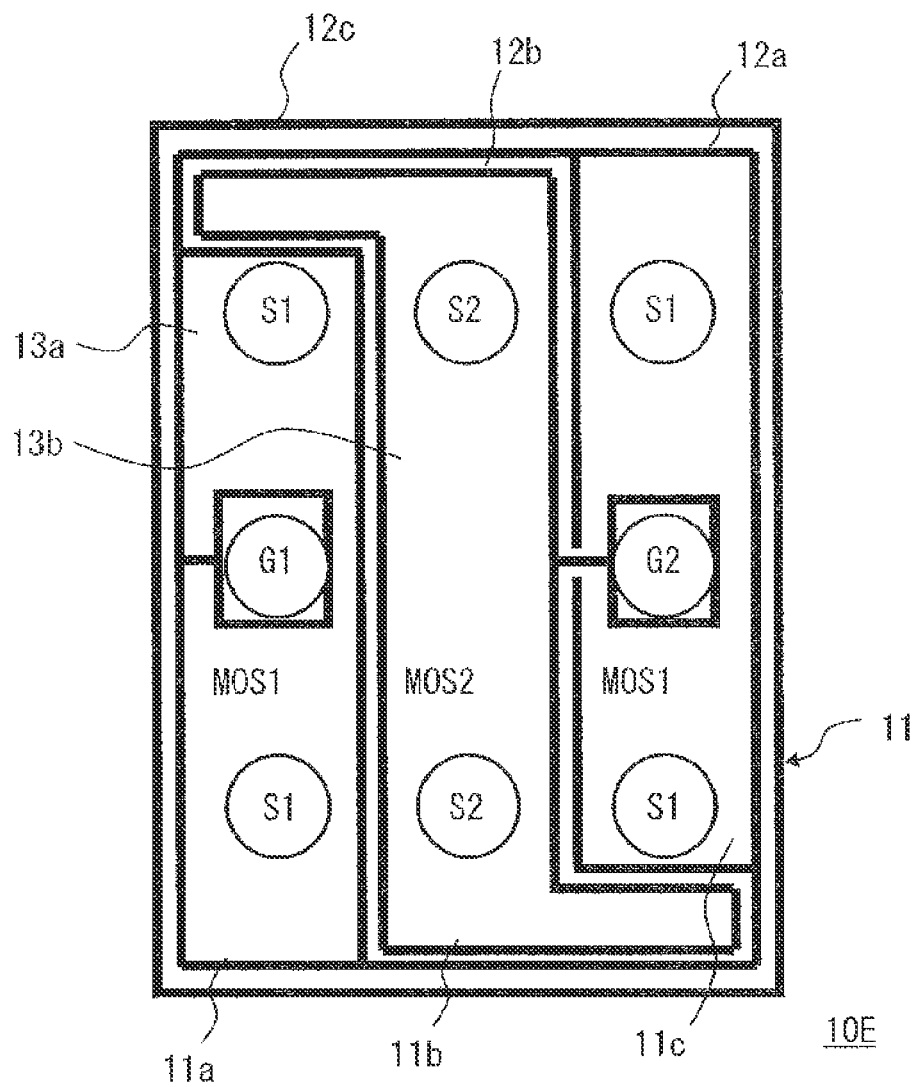
FIG. 18 shows a configuration example of a gate line of a semiconductor device shown in FIG. 17.

A configuration of a semiconductor device according to a sixth embodiment is explained hereinafter with reference to FIGS. 17 and 18. FIG. 17 shows a configuration of a semiconductor device 10F according to a sixth embodiment. FIG. 18 shows a configuration example of a gate line(s) of the semiconductor device 10F shown in FIG. 17. In FIGS. 17 and 18, the same symbols are assigned to the same components as those in the above descriptions and their explanations are omitted as appropriate.

As described above, in the above embodiments, the sum of the effective cell areas of the divided MOS1 can be made larger than that of the MOS2. However, this area ratio may be changed depending on the manufacturing process and/or the aspect ratio of the chip.

When the aspect ratio of a chip is low (the side in the x-direction of a chip is longer than the side in the y-direction) in computer simulation, the size of the MOS1 becomes significantly larger than that of the MOS2 when pads are disposed at regular intervals under the restriction imposed for the packaging. Therefore, there are cases where the size of the MOS2 needs to be adjusted.

In the sixth embodiment, in order to adjust the size of the MOS2, the second area 11b is formed so that parts of the second area 11b protrude into the first area 11a side and the third area 11c side. In the example shown in FIG. 17, the first area 11a is disposed in the lower-left corner of the chip 11 and the third area 11c is disposed in the upper right corner. Therefore, the second area 11b is formed in roughly an inverted S-shape in plan view. Note that the arrangement of the source pads S1 and S2 and the gate pads G1 and G2 is similar to that of the second embodiment, and therefore its explanation is omitted.

As shown in FIG. 18, the second gate line 12b is disposed along the contour of the second area 11b. That is, the second gate line 12b is formed so as to be disposed along the border of the inverted S-shaped second area 11b. Further, the gate line 12a is disposed so as to surround each of the first area 11a and the third area 11c. The first gate line 12a of the first area 11a and the first gate line 12a of the third area 11c are connected to each other. Note that a part of the first gate line 12a of the third area 11c is opened so that a line connecting the second gate line 12b with the gate pad G2 is formed. Further, the EQR line 12c surrounds all of the first area 11a, the second area 11b, and the third area 11c. With the configuration like this, it is possible to reduce the inter-source electrode resistance RSS(on). Further, similarly to the second embodiment, since all the pads can be disposed in the peripheral area of the chip, the lines on the circuit board side can be disposed outside the chip. Therefore, a layout using single-layer wiring can be easily made. Nevertheless, if the withstand voltage is sufficient, the EQR line 12c may be omitted.

Further, similarly to the MOS2 shown in FIG. 10, a third source pad S2 may also be disposed between the two source pads S2 in the MOS2 shown in FIG. 17 or 18. In this case, since only one line needs to be disposed along the longitudinal direction of the MOS2 in the circuit board in order to connect the plurality of source pads S2, a layout using single-layer wiring can be easily made as in the case of FIGS. 5 and 6.

Seventh Embodiment

Figure 19:
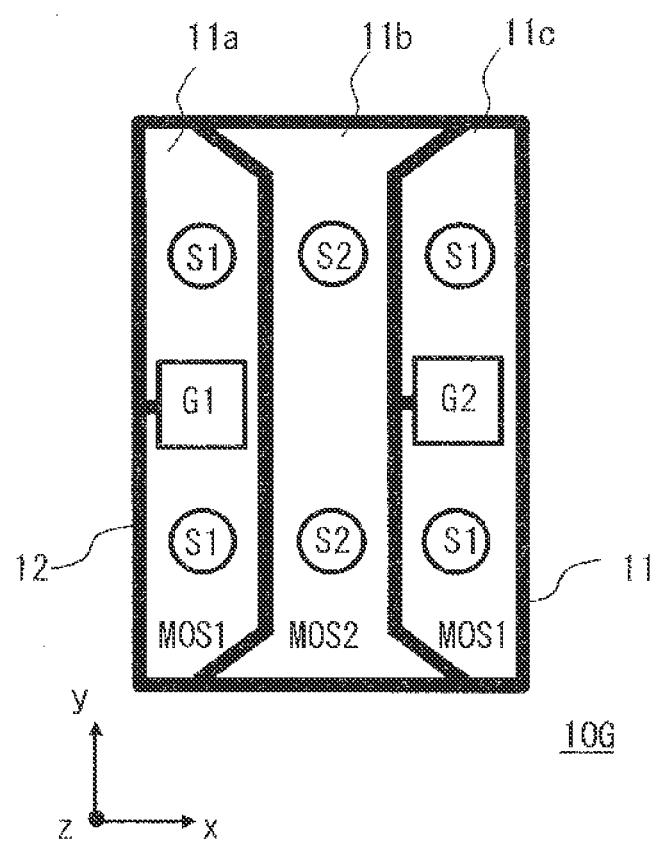
FIG. 19 shows another configuration of a semiconductor device according to a seventh embodiment.
Figure 20:
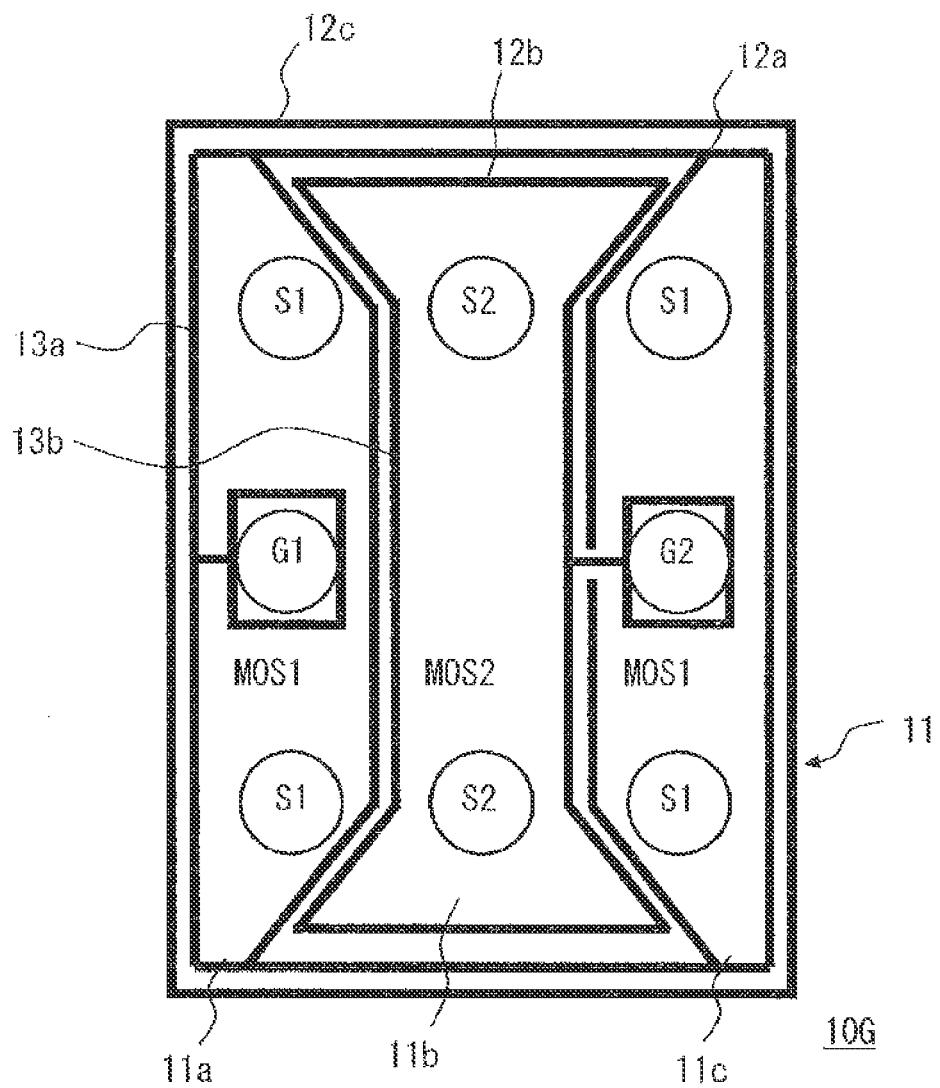
FIG. 20 shows a configuration example of a gate line of a semiconductor device shown in FIG. 19.

A configuration of a semiconductor device according to a seventh embodiment is explained hereinafter with reference to FIGS. 19 and 20. FIG. 19 shows a configuration of a semiconductor device 10G according to a seventh embodiment. FIG. 20 shows a configuration example of a gate line(s) of the semiconductor device 10G shown in FIG. 19.

In FIGS. 19 and 20, the same symbols are assigned to the same components as those in the above descriptions and their explanations are omitted as appropriate. In the seventh embodiment, similarly to the sixth embodiment, the second area 11b is formed so that the ends of the second area 11b protrude into the first area 11a side and the third area 11c side in order to adjust the size of the MOS2.

In the example shown in FIG. 19, the second area 11b is formed in such a manner that the second area 11b spreads in a diagonal direction toward the first area 11a side and the third area 11c side on both of the short-side sides of the chip 11. Note that the arrangement of the source pads S1 and S2 and the gate pads G1 and G2 is similar to that of the second embodiment, and therefore its explanation is omitted.

As shown in FIG. 20, the second gate line 12b is disposed so as to spread in a diagonal direction toward the first area 11a side and the third area 11c side along the contour of the second area 11b. Further, the gate line 12a is disposed along the second gate line 12b so as to surround each of the first area 11a and the third area 11c. The first gate line 12a of the first area 11a and the first gate line 12a of the third area 11c are connected to each other. Note that a part of the first gate line 12a of the third area 11c is opened so that a line connecting the second gate line 12b with the gate pad G2 is formed. Further, the EQR line 12c surrounds all of the first area 11a, the second area 11b, and the third area 11c. With the configuration like this, it is possible to reduce the inter-source electrode resistance RSS(on). Further, similarly to the second embodiment, since all the pads can be disposed in the peripheral area of the chip, the lines on the circuit board side can be disposed outside the chip. Therefore, a layout using single-layer wiring can be easily made. Nevertheless, if the withstand voltage is sufficient, the EQR line 12c may be omitted.

Further, similarly to the MOS2 shown in FIG. 10, a third source pad S2 may also be disposed between the two source pads S2 in the MOS2 shown in FIG. 19 or 20. In this case, since only one line needs to be disposed along the longitudinal direction of the MOS2 in the circuit board in order to connect the plurality of source pads S2, a layout using single-layer wiring can be easily made as in the case of FIGS. 5 and 6.

EXAMPLES

Figure 21:
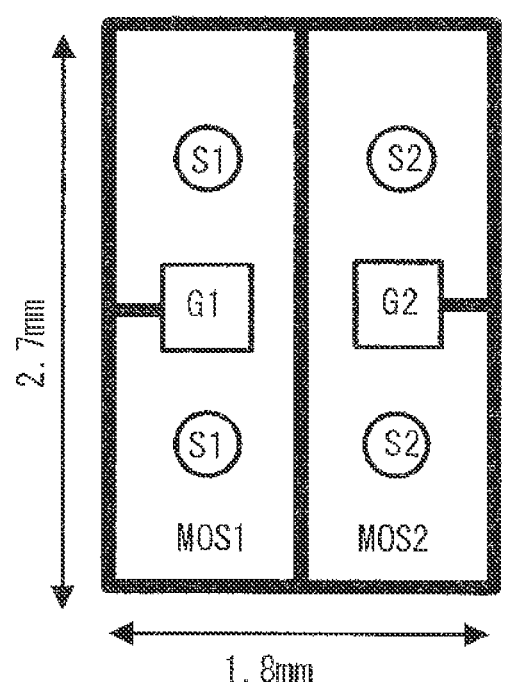
FIG. 21 shows a configuration of a comparative example.

An example of the semiconductor device 10A according to the second embodiment is explained. FIG. 21 shows a comparative example in which a chip is partitioned into two areas and the partitioned areas are used as a MOS1 and a MOS2 respectively. Assume that the chip sizes are both x of 1.8 mm (width)×y of 2.7 mm (length).

When the MOS1 is divided into two areas and the MOS2 is disposed between the divided areas of the MOS1 as in the case of the second embodiment, the effective cell area becomes smaller than that of the comparative example shown in FIG. 21 by about 8.8% because of the increase in the ineffective area due to increasing a gate line area. However, according to a simulation result, the inter-source electrode resistance RSS(on) of the semiconductor device 10A is lower than that of the example shown in FIG. 21 by 4.3%.

When this embodiment is applied, the normalized on-resistance per effective cell area improves by 4.9% even though the size of the effective cell area itself of the MOS decreases. Therefore, the inter-source electrode resistance RSS(on), which is the most important indicator of the performance for the one-chip dual type MOSFET for lithium-ion battery protection, can be lowered.

The above embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Each of the first area 11a, the second area 11b, and the third area 11c typically includes two source pads in the above embodiments, another source pad can be added in each of the first to third areas 11a to 11c. For example, in FIG. 1, the pad arrangement of S1/G1/S1 in the first areas 11a and 11c may be modified to S1/G1/S1/S1, respectively, and the pad arrangement of S2/G2/S2 in the second area 11b may be modified to S2/G2/S2/S2. For another example, in FIG. 5, the pad arrangement of S1/G1/S1 in the first area 11a may be modified to S1/G1/S1/S1, the pad arrangement of S2/no pad/S2 in the second area 11b may be modified to S2/no pad/S2/S2, and the pad arrangement of S1/G2/S1 in the third area 11c may be modified to S1/G2/S1/S1. Likewise, in the other embodiments described above, another source pad may be put in between two pads in each of the first to third areas 11a to 11c so that the added source pads are arranged into line with each other.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    a semiconductor substrate having a front surface and a back surface opposite to each other, the front surface having a rectangular shape comprising a first side, a second side opposite to the first side, a third side, and a fourth side opposite to the third side, in a plan view;
    a first MOSFET having a first gate electrode, a first source region and a first drain region, provided over the front surface;
    a second MOSFET having a second gate electrode, a second source region and a second drain region provided over the front surface;
    a first source electrode coupled to the first source region, disposed over the front surface;
    a second source electrode coupled to the second source region, disposed over the front surface;
    a first gate line coupled to the first gate electrode, disposed over the front surface;
    a second gate line coupled to the second gate electrode, disposed over the front surface;
    a common drain electrode coupled to the first drain region and the second drain region, provided over the back surface,
    wherein the first source electrode is disposed at the first, second, third and fourth sides of the front surface,
    wherein the second source electrode is surrounded by the first source electrode at the first, second, third and fourth sides of the front surface in the plan view,
    wherein the first source electrode overlaps the first MOSFET in the plan view, and
    wherein the second source electrode overlaps the second MOSFET in the plan view.

2. The semiconductor device according to claim 1, wherein a size of the first MOSFET is larger than a size of the second MOSFET.

3. The semiconductor device according to claim 1, further comprising:
    a first gate pad disposed in the first side, the first gate pad being electrically connected to the first MOSFET; and
    a second gate pad disposed in the second side, the second gate pad being electrically connected to the second MOSFET.

4. The semiconductor device according to claim 3, wherein there is no gate pad disposed on the second source electrode.

5. The semiconductor device according to claim 3, wherein each of the first and the second sides includes two source pads, and
    each of the first and second gate pads is disposed so as to be sandwiched between the two source pads.

6. The semiconductor device according to claim 5, wherein a source pad of the second MOSFET is formed over the second source electrode in a place sandwiched between the two source pads.

7. The semiconductor device according to claim 3, wherein each of the first and second sides includes two source pads,
    in the first side, one of the source pads is disposed so as to be sandwiched between another of the source pads and the first gate pad,
    in the second side, one of the source pads is disposed so as to be sandwiched between another of the source pads and the second gate pad, and
    the first and second gate pads are disposed so as to be arranged in a row a short side of the chip.

8. A method of manufacturing a semiconductor device, comprising:
    forming a semiconductor substrate having a front surface and a back surface opposite to each other, the front surface having a rectangular shape comprising a first side, a second side opposite to the first side, a third side, and a fourth side opposite to the third side, in a plan view;

forming a first MOSFET having a first gate electrode, a first source region and a first drain region, provided over the front surface;

forming a second MOSFET having a second gate electrode, a second source region and a second drain region provided over the front surface;

forming a first source electrode coupled to the first source region, disposed over the front surface;

forming a second source electrode coupled to the second source region, disposed over the front surface;

forming a first gate line coupled to the first gate electrode, disposed over the front surface;

forming a second gate line coupled to the second gate electrode, disposed over the front surface;

forming a common drain electrode coupled to the first drain region and the second drain region, provided over the back surface, wherein the first source electrode is disposed at the first, second, third and fourth sides of the front surface, wherein the second source electrode is surrounded by the first source electrode at the first, second, third and fourth sides of the front surface in the plan view, wherein the first source electrode overlaps the first MOSFET in the plan view, and wherein the second source electrode overlaps the second MOSFET in the plan view.

9. The method of manufacturing a semiconductor device according to claim 8, wherein a size of the first MOSFET is made larger than a size of the second MOSFET.

10. The method of manufacturing a semiconductor device according to claim 8, wherein a first gate pad is disposed in the first side, the first gate pad being electrically connected to the first MOSFET; and a second gate pad is disposed in the second side, the second gate pad being electrically connected to the second MOSFET.

11. The method of manufacturing a semiconductor device according to claim 10, wherein there is no gate pad disposed on the second source electrode.

12. The method of manufacturing a semiconductor device according to claim 10, wherein:

two source pads are formed in each of the first and second sides, and each of the first and second gate pads is disposed so as to be sandwiched between the two source pads.

13. The method of manufacturing a semiconductor device according to claim 12, wherein a source pad of the second MOSFET is formed over the second source electrode in a place sandwiched between the two source pads.

14. The method of manufacturing a semiconductor device according to claim 10, wherein two source pads are formed in each of the first and second sides, in the first side, one of the source pads is disposed so as to be sandwiched between another of the source pads and the first gate pad, in the second side, one of the source pads is disposed so as to be sandwiched between another of the source pads and the second gate pad, and the first and second gate pads are disposed so as to be arranged in a row at a short side of the chip.

15. The semiconductor device according to claim 1, wherein the first source electrode has a ring shape in the plan view.

16. The method of manufacturing a semiconductor device according to claim 8, wherein the first source electrode has a ring shape in the plan view.

* * * * *